(12) United States Patent
Kadota et al.

(10) Patent No.: US 7,339,304 B2
(45) Date of Patent: Mar. 4, 2008

(54) SURFACE ACOUSTIC WAVE DEVICE

(75) Inventors: Michio Kadota, Kyoto (JP); Takeshi Nakao, Omihachiman (JP); Takuo Hada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 176 days.

(21) Appl. No.: 10/595,237

(22) PCT Filed: Aug. 6, 2004

(86) PCT No.: PCT/JP2004/011364

§ 371 (c)(1),
(2), (4) Date: Mar. 29, 2006

(87) PCT Pub. No.: WO2005/034347

PCT Pub. Date: Apr. 14, 2005

(65) Prior Publication Data

US 2007/0096592 A1    May 3, 2007

(30) Foreign Application Priority Data

Oct. 3, 2003    (JP) ............................. 2003-346280

(51) Int. Cl.
*H01L 41/08* (2006.01)
(52) U.S. Cl. .............................. 310/313 A; 310/313 R; 310/364
(58) Field of Classification Search ............ 310/313 A, 310/313 R, 313 B, 363, 364
See application file for complete search history.

(56) References Cited

U.S. PATENT DOCUMENTS 4,243,960 A * 1/1981 White et al. ................. 333/196
5,726,610 A * 3/1998 Allen et al. .................. 333/133
5,923,231 A    7/1999 Ohkubo et al.

FOREIGN PATENT DOCUMENTS

EP    0920129 A1    6/1999

(Continued)

OTHER PUBLICATIONS

Jiang et al., "The Leaky Surface Wave in $SiO_2/49°$ Y-X $LiNbO_3$ Structure," IEEE Ultrasonics Symposium, 1989, pp. 295-298.
International Search Report for PCT Application No. PCT/JP2004/011364, mailed Sep. 28, 2004.
Official communication issued in the counterpart German Application No. 112004001841.2, mailed on Jul. 10, 2007.

*Primary Examiner*—Mark Budd
(74) *Attorney, Agent, or Firm*—Keating & Bennett, LLP

(57) ABSTRACT

A surface acoustic wave device includes a piezoelectric substrate made of $LiNbO_3$ having an electromechanical coupling coefficient k whose square is at least about 0.025, at least one electrode that is made of a metal whose density is greater than that of Al or an alloy primarily including the metal or that is composed of laminated films made of a metal whose density is greater than that of Al or an alloy primarily including the metal and another metal, the electrode being disposed on the piezoelectric substrate, a first insulating layer disposed in a region other than a region where the at least one electrode is disposed, the thickness of the first insulating layer being substantially equal to that of the electrode, and a second insulating layer covering the electrode and the first insulating layer. The density of the electrode is at least about 1.5 times greater than that of the first insulating layer.

35 Claims, 27 Drawing Sheets

FOREIGN PATENT DOCUMENTS

| | | |
|---|---|---|
| EP | 1391988 A2 | 2/2004 |
| JP | 61-136312 | 6/1986 |
| JP | 63-260213 | 10/1988 |
| JP | 06-164293 | 6/1994 |
| JP | 08-125485 | 5/1996 |
| JP | 11-186866 | 7/1999 |
| JP | 2002-084156 | 3/2002 |
| JP | 2004-080150 | 3/2004 |
| JP | 2004-112748 | 4/2004 |

* cited by examiner

θ(°) OF EULER ANGLES (10, θ, 180)

θ(°) OF EULER ANGLES (10, θ, 20)

θ(°) OF EULER ANGLES (10, θ, 120)

θ(°) OF EULER ANGLES (10, θ, 160)

θ(°) OF EULER ANGLES (20, θ, 0)

θ(°) OF EULER ANGLES (20, θ, 20)

θ(°) OF EULER ANGLES (30, θ, 20)

θ(°) OF EULER ANGLES (30, θ, 140)

ρ(ELECTRODE)/ρ(INSULATOR)=2.5

ρ(ELECTRODE)/ρ(INSULATOR)=2.0

ρ(ELECTRODE)/ρ(INSULATOR)=1.5

ρ(ELECTRODE)/ρ(INSULATOR)=1.2

ρ(ELECTRODE)/ρ(INSULATOR)=1.0
RIPPLE CAUSED BY INSUFFICIENT REFLECTION COEFFICIENT

NORMALIZED FREQUENCY

SURFACE ACOUSTIC WAVE DEVICE

BACKGROUND OF THE INVENTION

1. Field of the Invention

The present invention relates to surface acoustic wave (SAW) devices used for resonators or band-pass filters and a method for manufacturing the same. More specifically, the present invention relates to a SAW device including an insulating layer that covers an interdigital transducer (IDT) electrode.

2. Description of the Related Art

In duplexers (DPX) or radio frequency (RF) filters used in mobile communication systems, a wideband characteristic and a favorable temperature characteristic must be satisfied at the same time. SAW devices that have conventionally been used for DPXs or RF filters use a piezoelectric substrate made of 36° to 50°-rotated Y-cut X-propagating $LiTaO_3$. This piezoelectric substrate has a temperature coefficient of frequency of about −40 ppm/° C. to about −30 ppm/° C. As a method for improving the temperature characteristic, a method for forming a $SiO_2$ film having a positive temperature coefficient of frequency to cover an IDT electrode on a piezoelectric substrate is known. FIG. 30 shows an example of a method for manufacturing this type of SAW device.

As shown in FIG. 30A, a resist pattern 52 is formed on a piezoelectric substrate 51 except in a region where an IDT electrode is to be formed. Then, as shown in FIG. 30B, an electrode film 53 defining an IDT electrode is formed over an entire surface. Then, the resist pattern 52 and the metal film on the resist pattern 52 are removed using a resist removing agent. In this manner, an IDT electrode 53A is formed, as shown in FIG. 30C. Then, as shown in FIG. 30D, a $SiO_2$ film 54 is formed to cover the IDT electrode 53A.

Japanese Unexamined Patent Application Publication No. 11-186866 (Patent Document 1) discloses a method for manufacturing a SAW device including an insulating or semiconducting protective film covering an IDT electrode of the SAW device, the method is used for reasons other than improving the above-described temperature coefficient of frequency. FIG. 31 is a schematic cross-sectional view showing the SAW device described in this known art. In the SAW device 61, an IDT electrode 64 made of Al or an alloy primarily including Al is disposed on a piezoelectric substrate 62. An insulating or semiconducting inter-electrode-finger film 64 is disposed in a region except the region where the IDT electrode 63 is disposed.

Furthermore, an insulating or semiconducting protective film 65 is arranged to cover the IDT electrode 63 and the inter-electrode-finger film 64. In the SAW device 61 described in this known art, the inter-electrode-finger film 64 and the protective film 65 are made of an insulating material, such as $SiO_2$, or a semiconducting material, such as silicon. According to this known art, forming the inter-electrode-finger film 63 suppresses degradation of a characteristic caused by inter-electrode-finger discharge due to a pyroelectric property of the piezoelectric substrate 61.

On the other hand, Japanese Unexamined Patent Application Publication No. 61-136312 (Patent Document 2) discloses a one-port SAW resonator. This one-port SAW resonator is manufactured by forming an electrode made of metal, such as aluminum or gold, on a piezoelectric substrate made of quartz or lithium niobate, forming a $SiO_2$ film thereon, and then smoothing the $SiO_2$ film. According to Patent Document 2, a favorable resonance characteristic is obtained by smoothing.

As shown in FIGS. 30A-30D, in the known method for manufacturing a SAW device of forming a $SiO_2$ film, in order to improve a temperature coefficient of frequency, the height of the $SiO_2$ film 54 differs at a portion where the IDT electrode 53A exists and at a portion where the IDT electrode 53A does not exist. Such an uneven surface of the $SiO_2$ film 54 disadvantageously increases insertion loss. This unevenness becomes more significant as the thickness of the IDT electrode increases. Therefore, the film thickness of the IDT electrode cannot be increased.

In the SAW device described in Patent Document 1, the inter-electrode-finger film 64 is formed between electrode fingers of the IDT electrode 63 and then the protective film 65 is formed thereon. In this method, the surface of the protective film 65 can be smoothed.

However, in the structure described in Patent Document 1, the IDT electrode 63 is made of Al or an alloy primarily including Al. The inter-electrode-finger film 64 contacts the IDT electrode 63, however, a sufficient reflection coefficient cannot be obtained in the IDT electrode 63. Accordingly, ripples occur in a resonance characteristic, for example.

In the manufacturing method described in Patent Document 1, a resist formed on the inter-electrode-finger film 64 must be removed using a resist removing agent before forming the protective film 65. At this time, however, the IDT electrode 63 may be corroded by the resist removing agent. For this reason, a metal that is susceptible to corrosion cannot be used as a material of the IDT electrode. In other words, the type of metallic material of the IDT electrode is limited.

On the other hand, in the one-port SAW resonator described in Patent Document 2, a specific preferred embodiment includes only an example in which an electrode made of Al is formed on a quartz substrate, although it is described that quartz or lithium niobate is used for the piezoelectric substrate and that the electrode is made of aluminum or gold. That is, Patent Document 2 does not refer to a SAW device using another substrate material or another metallic material.

SUMMARY OF THE INVENTION

To overcome the problems described above, preferred embodiments of the present invention provide a SAW device in which an insulating layer is disposed between electrode fingers of an IDT electrode and on the IDT electrode, and a method for manufacturing the same. More specifically, preferred embodiments of the present invention provide a SAW device having a greatly improved resonance and filter characteristics, in which the reflection coefficient of an IDT electrode is sufficiently high and degradation of characteristic due to ripples in the resonance characteristic are suppressed, and a method for manufacturing the same.

The SAW device according to preferred embodiments of the present invention not only has a favorable characteristic with a sufficiently high reflection coefficient of an IDT electrode, but also has a high degree of freedom in selecting a metallic material of the IDT electrode and is capable of suppressing an adverse effect of corrosion of the IDT electrode.

In addition, the SAW device according to preferred embodiments of the present invention not only has a favorable characteristic with a sufficiently high reflection coefficient of an IDT electrode and is capable of suppressing degradation of characteristic due to corrosion of the IDT electrode, but also has a favorable temperature coefficient of frequency.

According to a first preferred embodiment, a surface acoustic wave device includes a piezoelectric substrate made of LiNbO₃ having an electromechanical coupling coefficient whose square ($k^2$) is at least about 0.025, at least one electrode made of a metal having a density that is higher than that of Al or an alloy primarily including the metal or that includes laminated films made of a metal whose density is higher than that of Al or an alloy primarily including the metal and another metal, the electrode disposed on the piezoelectric substrate, a first insulating layer disposed in a region other than a region where the at least one electrode is disposed, the thickness of the first insulating layer being substantially equal to that of the electrode, and a second insulating layer covering the electrode and the first insulating layer. The density of the electrode is at least about 1.5 times greater than that of the first insulating layer.

According to a second preferred embodiment, a surface acoustic wave device includes a piezoelectric substrate made of LiNbO₃, at least one electrode disposed on the piezoelectric substrate, a protective metal film made of a metal or an alloy that is more corrosion-resistant than a metal or alloy included in the electrode, the protective metal film being disposed on the electrode, a first insulating layer disposed in a region other than a region where the at least one electrode is disposed, the thickness of the first insulating layer being substantially equal to the total thickness of the electrode and the protective metal film, and a second insulating layer covering the protective metal film and the first insulating layer.

In the second preferred embodiment, an average density of an entire laminated structure including the electrode and the protective metal film is preferably at least about 1.5 times greater than the density of the first insulating layer.

In the first and second preferred embodiments, the first and second insulating layers are preferably made of SiO₂, reflection of surface acoustic waves is preferably used in the surface acoustic wave device, and the height of a convex portion on a surface of the second insulating layer is preferably about 0.03λ or less when the wavelength of a surface acoustic wave is λ.

In the surface acoustic wave device according to the first and second preferred embodiments, the height of a convex portion on the second insulating layer is preferably about ½ or less of the thickness of the electrode. More preferably, the height of the convex portion is about ⅓ or less of the thickness of the electrode.

In the surface acoustic wave device according to the first and second preferred embodiments, the electrode primarily includes a metal that is heavier than Al. Preferably, the electrode primarily includes a metal selected from a group consisting of Au, Pt, Cu, Ta, W, Ag, Ni, Mo, NiCr, Cr, and Ti. And more preferably, the electrode is made of Au or Pt and the thickness thereof is in the range of about 0.0017λ to about 0.06λ when the wavelength of a surface acoustic wave is λ.

According to another preferred embodiment of the present invention, the electrode primarily includes a metal selected from a group consisting of Au, Ag, Ni, Mo, Zn, Cu, Pt, Ta, W, Cr, and Ti, and the thickness of the electrode is in the range shown in the following Table 1 when the wavelength of a surface acoustic wave is λ.

TABLE 1

| | |
|---|---|
| Au | 0.0017 λ~0.06 λ |
| Pt | 0.0017 λ~0.06 λ |
| Ag | 0.0035 λ~0.10 λ |
| Ta | 0.0025 λ~0.064 λ |
| W | 0.0035 λ~0.06 λ |
| Cu | 0.0058 λ~0.11 λ |
| Ni | 0.012 λ~0.12 λ |
| Cr | 0.012 λ~0.12 λ |
| Ti | 0.012 λ~0.12 λ |
| Mo | 0.012 λ~0.12 λ |
| Zn | 0.012 λ~0.12 λ |

According to preferred embodiment of the surface acoustic wave device, the thickness of the second insulating layer is in the range of about 0.15λ to about 0.4λ when the wavelength of a surface acoustic wave is λ.

Preferably, the thickness of the second insulating layer is in the range of about 0.2λ to about 0.3λ when the wavelength of a surface acoustic wave is λ.

According to another preferred embodiment of the surface acoustic wave device, Euler angles of the piezoelectric substrate made of LiNbO₃ are in the ranges shown in the following Table 2.

TABLE 2

| Euler angles |
|---|
| (0 ± 5, 62~167, 0 ± 10) |
| (0 ± 5, 87~158, 20 ± 10) |
| (0 ± 5, 112~165, 80 ± 10) |
| (0 ± 5, 107~167, 100 ± 10) |
| (10 ± 5, 110~162, 80 ± 10) |
| (10 ± 5, 69~108, 100 ± 10) |
| (10 ± 5, 72~140, 160 ± 10) |
| (20 ± 5, 99~121, 160 ± 10) |
| (30 ± 5, 67~113, 0 ± 10) |
| (30 ± 5, 27~125, 140 ± 10) |
| (30 ± 5, 67~103, 160 ± 10) |

According to another preferred embodiment of the surface acoustic wave device, Euler angles of the piezoelectric substrate made of LiNbO₃ are in the ranges shown in the following Table 3.

TABLE 3

| $k_R^2 \leq 0.01$ |
|---|
| (0 ± 5, 80~160, 0 ± 10) |
| (0 ± 5, 100~142, 0 ± 10) |
| (0 ± 5, 112~165, 80 ± 10) |
| (0 ± 5, 107~167, 100 ± 10) |
| (10 ± 5, 123~158, 80 ± 10) |

TABLE 3-continued $k_R^2 \leq 0.01$ (10 ± 5, 74~90, 100 ± 10)
(10 ± 5, 87~128, 160 ± 10)
(20 ± 5, 99~119, 160 ± 10)
(30 ± 5, 82~98, 0 ± 10)
(30 ± 5, 28~53, 140 ± 10)
(30 ± 5, 70~103, 160 ± 10)

According to another preferred embodiment of the surface acoustic wave device, Euler angles of the piezoelectric substrate made of LiNbO$_3$ are in the ranges shown in the following Table 4.

TABLE 4

$k_R^2 \leq 0.049$ (0 ± 5, 88~117, 0 ± 10)
(0 ± 5, 115~124, 0 ± 10)
(0 ± 5, 115~135, 80 ± 10)
(0 ± 5, 109~157, 100 ± 10)
(10 ± 5, 130~146, 80 ± 10)
(10 ± 5, 80~87, 100 ± 10)
(10 ± 5, 98~118, 160 ± 10)
(20 ± 5, 110~118, 160 ± 10)
(30 ± 5, 86~94, 0 ± 10)
(30 ± 5, 33~47, 140 ± 10)
(30 ± 5, 77~103, 160 ± 10)

According to another preferred embodiment of the surface acoustic wave device, Euler angles of the piezoelectric substrate made of LiNbO$_3$ are in the ranges shown in the following Table 5.

TABLE 5

Euler angles (0 ± 5, 38 ± 10, 0)
(0 ± 5, 89 ± 10, 77~102 ± 5)
(0 ± 5, 130 ± 10, 79 ± 5)
(10 ± 5, 110 ± 10, 50~80 ± 5)
(10 ± 5, 110 ± 10, 106 ± 5)
(20 ± 5, 100 ± 10, 35~72 ± 5)
(20 ± 5, 100 ± 10, 100~110 ± 5)
(30 ± 5, 89 ± 10, 40~80 ± 5)
(30 ± 5, 100 ± 10, 40~117 ± 5)

According to still another preferred embodiment of the surface acoustic wave device, Euler angles of the piezoelectric substrate made of LiNbO$_3$ are in the ranges shown in the following Table 6.

TABLE 6

Euler angles (0 ± 5, 38 ± 10, 0)
(0 ± 5, 89 ± 10, 80~100 ± 5)
(10 ± 5, 110 ± 10, 50~80 ± 5)
(20 ± 5, 100 ± 10, 42~70 ± 5)
(30 ± 5, 89 ± 10, 42~76 ± 5)
(30 ± 5, 100 ± 10, 42~72 ± 5)

The surface acoustic wave device according to the first preferred embodiment includes a first insulating layer disposed in a region other than a region where at least one electrode is disposed, the thickness of the first insulating layer being substantially equal to that of the electrode, and a second insulating layer covering the electrode and the first insulating layer. The electrode is made of a metal having a higher density than that of the first insulating layer or an alloy primarily including the metal, such that the electrode has a sufficient reflection coefficient. Accordingly, a SAW device which suppresses degradation of characteristics due to undesirable ripple and which has a favorable temperature coefficient of frequency is provided.

In addition, the thickness of the IDT electrode is substantially equal to that of the second insulting layer, and the second insulating layer is laminated to cover the IDT and the first insulating layer. With this configuration, the outer surface of the second insulating layer can be smoothed, such that degradation of characteristics due to unevenness of the surface of the second insulating layer is suppressed.

In the first preferred embodiment, the piezoelectric substrate is made of LiNbO$_3$ having an electromechanical coupling coefficient whose square is at least about 0.025. Thus, the bandwidth can be widened.

In the surface acoustic wave device according to the second preferred embodiment, the first insulating layer is disposed in a region other than a region where the electrode is disposed on the piezoelectric substrate made of LiNbO$_3$, the thickness of the first insulating layer is substantially equal to that of the electrode, the protective metal film is made of a metal or alloy that is more corrosion-resistant than a metal or alloy included in the electrode, and the second insulating layer covers the protective metal film and the first insulating layer. Since the electrode is covered by the protective metal film and the first insulating layer, corrosion of the electrode due to a resist removing agent is prevented when a resist is removed by photolithography. Therefore, the electrode can be made of a metal or alloy that is susceptible to corrosion by a resist removing agent, but that has a sufficiently higher density than that of Al, for example, Cu. Accordingly, degradation of characteristics of the SAW device is effectively suppressed.

In the second preferred embodiment, when an average density of an entire laminated structure including the electrode and the protective metal film is at least about 1.5 times greater than the density of the first insulating layer, the reflection coefficient of the electrode is effectively increased.

In the first and second preferred embodiments, when the first and second insulating layers are made of SiO$_2$, a SAW device having an improved temperature coefficient of frequency TCF is provided.

In preferred embodiments of the present invention, when the height of the convex portion on the surface of the second insulating layer is about 0.03λ or less, insertion loss is effectively suppressed.

When the height of the convex portion on the second insulating layer is about ½ or less of the thickness of the electrode, insertion loss of the SAW device is effectively suppressed. When the height of the convex portion is about ⅓ or less of the thickness of the electrode, the insertion loss is suppressed more effectively.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, specific preferred embodiments of the present invention are described with reference to the drawings.

A method for manufacturing a surface acoustic wave (SAW) device according to a first preferred embodiment of the present invention is described with reference to FIGS. 1 and 2.

Figure 1A:
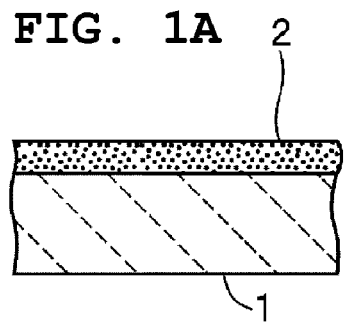
FIGS. 1A to 1G are schematic partially-cutout cross-sectional views illustrating a method for manufacturing a SAW device according to a preferred embodiment of the present invention.

First, as shown in FIG. 1A, a LiNbO$_3$ substrate 1 is prepared as a piezoelectric substrate.

A first insulating layer 2 is formed on an entire surface of the LiNbO$_3$ substrate 1. In this preferred embodiment, the first insulating layer 2 is made of a SiO$_2$ film.

The first insulating layer 2 is formed by an appropriate method, such as printing, evaporation, or sputtering. The thickness of the first insulating layer 2 is equal to that of an interdigital (IDT) electrode, which is formed later.

Figure 1B:
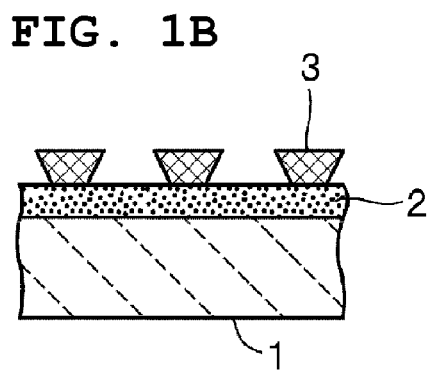

Then, as shown in FIG. 1B, a resist pattern 3 is formed using photolithography. The resist pattern 3 is formed such that a resist is disposed in a region except the region where the IDT electrode is to be formed.

Figure 1C:
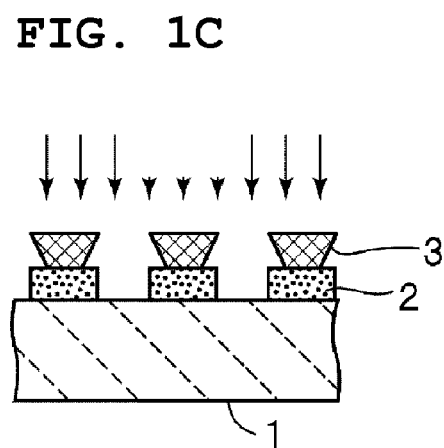

Then, the first insulating layer 2, except a portion under the resist 3, is removed by reactive ion etching (RIE) or other suitable method of applying ion beams, as indicated by arrows in FIG. 1C.

If a SiO$_2$ film is etched by a reactive ion etching (RIE) device using a fluorine gas, a residue may be left by a polymerization reaction. In that case, the residue of the RIE may be treated with BHF (buffered hydrofluoric acid).

Figure 1D:
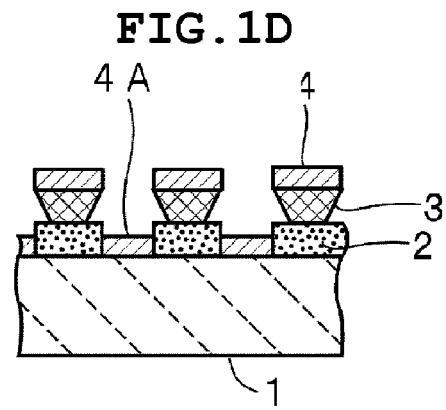
Figure 1E:
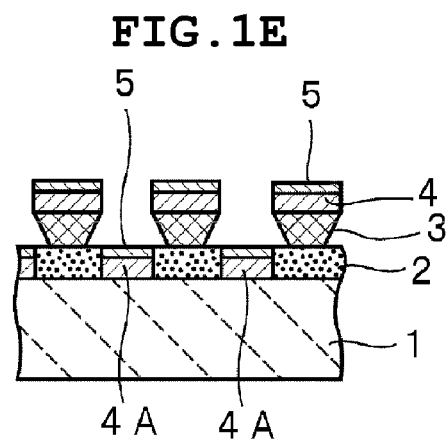

Subsequently, a Cu film and a Ti film are formed such that the total thickness thereof is equal to that of the first insulating layer 2. As shown in FIG. 1D, a Cu film 4 is formed in a region where the first insulating layer 2 has been removed, that is, in a region where an IDT is to be formed. At the same time, the Cu film 4 is formed on the resist pattern 3. Then, a Ti film 5 serving as a protective metal film is formed to cover the entire surface. As shown in FIG. 1E, the Ti film 5 is formed on the upper surface of an IDT electrode 4A and on the Cu film 4 on the resist pattern 3. Accordingly, the IDT electrode 4A is covered by the first insulating layer 2 on its side surfaces and by the Ti film 5 on it upper surface. In this manner, the IDT electrode 4A and the protective metal film are formed, such that the total thickness of the IDT electrode 4A and the Ti film 5 serving as a protective metal film is the same as the thickness of the first insulating layer 2.

Figure 1F:
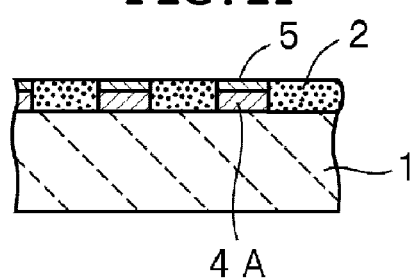

The resist pattern 3 is then removed using a resist removing agent. Accordingly, the structure shown in FIG. 1F is obtained. That is, the IDT electrode 4A is disposed in a region where the first insulating layer 2 has been removed, and the upper surface of the IDT electrode 4A is covered by the Ti film 5.

Figure 1G:
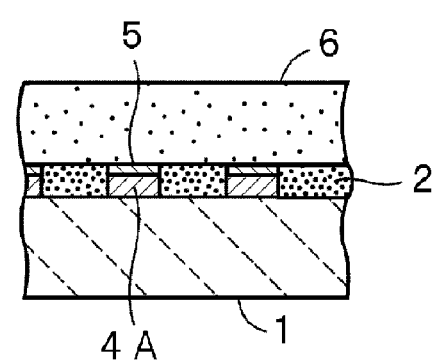

Then, as shown in FIG. 1G, a SiO$_2$ film as a second insulating layer 6 is formed over the entire surface.

Figure 2:
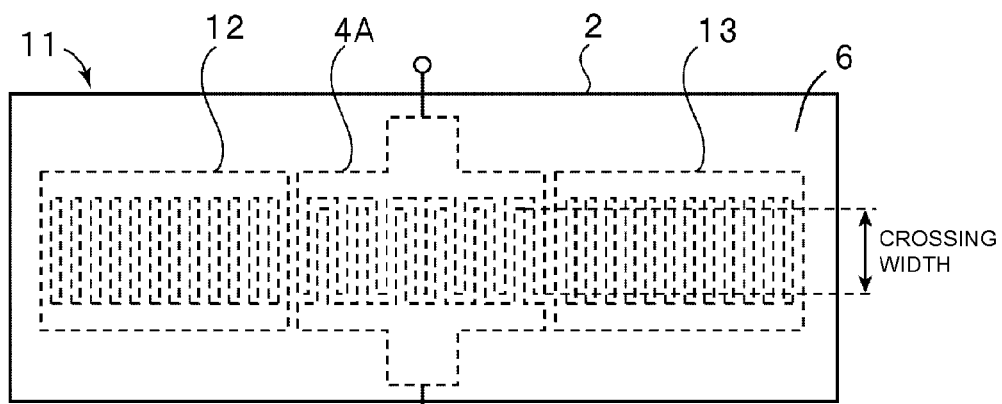
FIG. 2 is a schematic plan view of a one-port SAW resonator obtained in a preferred embodiment of the present invention.

Accordingly, a one-port SAW resonator 11 shown in FIG. 2 is produced.

FIGS. 1A to 1G show only a portion where the IDT electrode 4A is formed. However, as shown in FIG. 2, the SAW resonator 11 includes reflectors 12 and 13, which are placed on both sides of the IDT electrode 4A in a SAW propagating direction. The reflectors 12 and 13 are formed by the same process as that for the IDT electrode 4A.

In the above-described preferred embodiment, the one-port SAW resonator 11 is used, and thus, one IDT electrode 4A is provided on the LiNbO$_3$ substrate 1. However, a plurality of IDT electrodes may be provided depending on the application of the SAW device. Further, the reflectors may be formed by the same process as that for the IDT as described above. Alternatively, the reflectors may not be provided.

The density of the IDT electrode 4A is at least about 1.5 times greater than that of the first insulating layer 2, such that the IDT electrode 4A has a sufficient reflection coefficient.

SAW resonators were manufactured using the same method as that in the above-described preferred embodiment while variously changing the density of a metal contained in the IDT electrode 4A. The impedance characteristics of the respective SAW resonators obtained accordingly are shown in FIGS. 33A to 33E. FIGS. 33A to 33E show results obtained when the ratio $\rho_1/\rho_2$ of an average density $\rho_1$ of a laminated structure of the IDT electrode and the protective metal film to a density $\rho_2$ of the first insulating layer is approximately 2.5, 2.0, 1.5, 1.2, and 1.0, respectively.

Figure 33A:
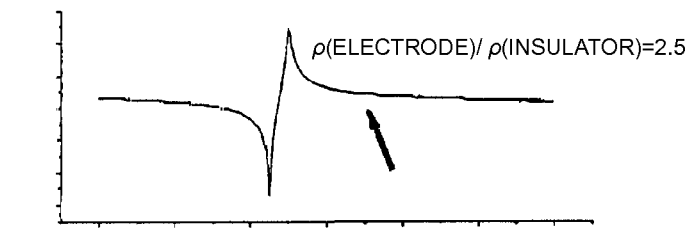
FIG. 33A to 33E show changes in impedance characteristic in accordance with change in ratio of an average density of an IDT electrode and a protective metal film to the density of a first insulating layer.
Figure 33B:
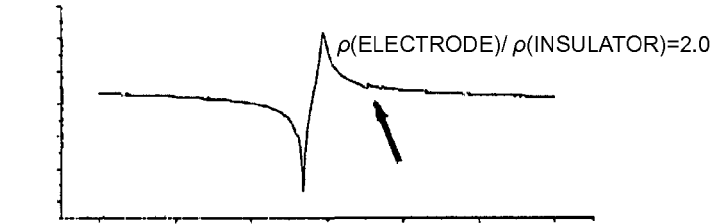
Figure 33C:
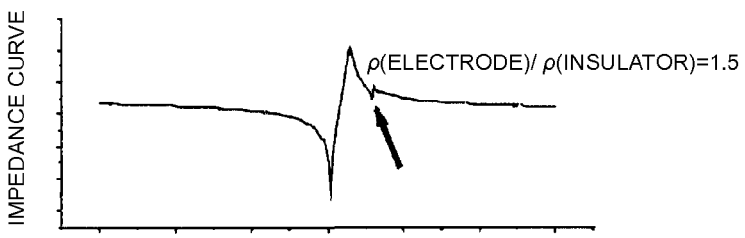
Figure 33D:
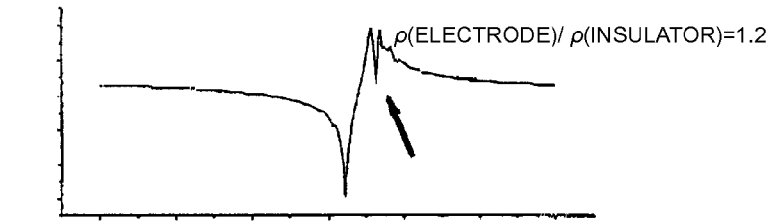
Figure 33E:
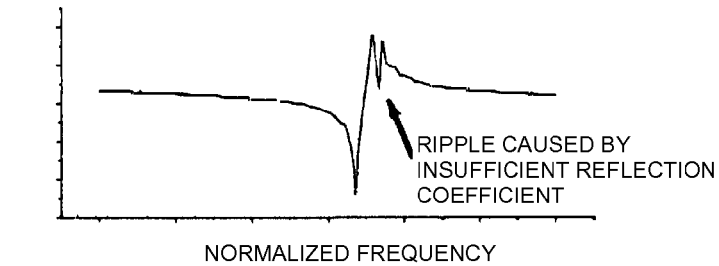
Figure 34:
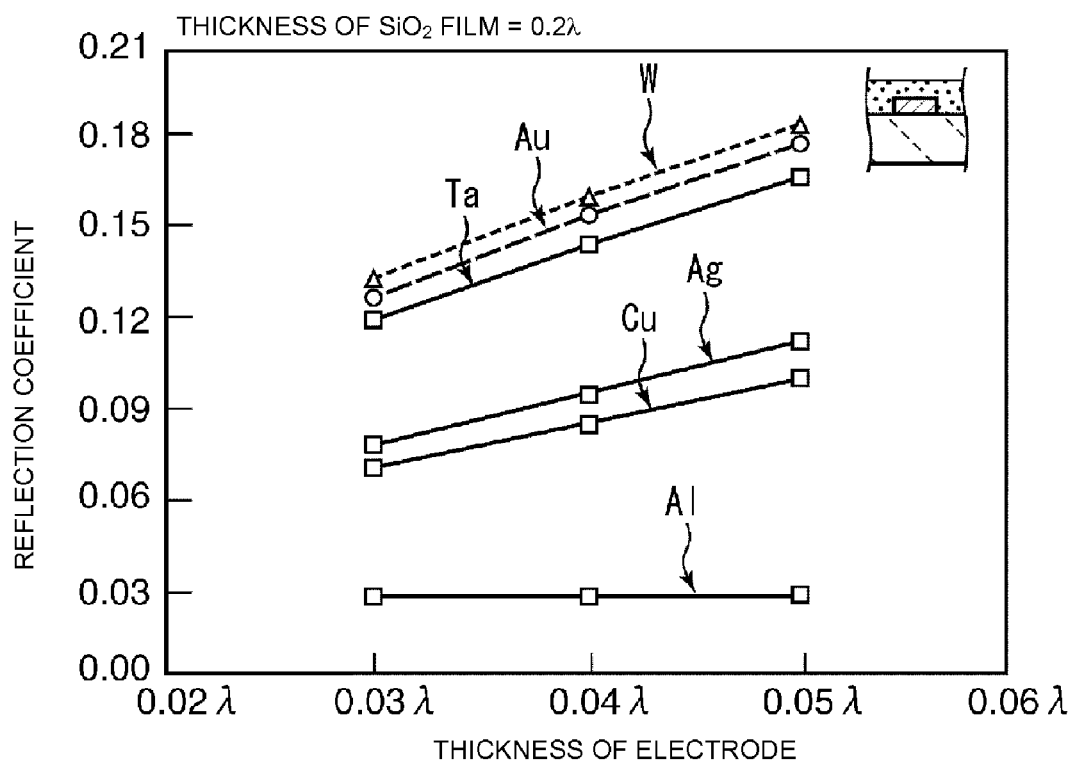
FIG. 34 shows a relationship between the thickness of an electrode and a reflection coefficient in a SAW device including a $SiO_2$ film having a thickness of about 0.2λ and a smooth upper surface placed on an electrode made of different metals placed on a $LiNbO_3$ substrate according to a preferred embodiment of the present invention.
Figure 35:
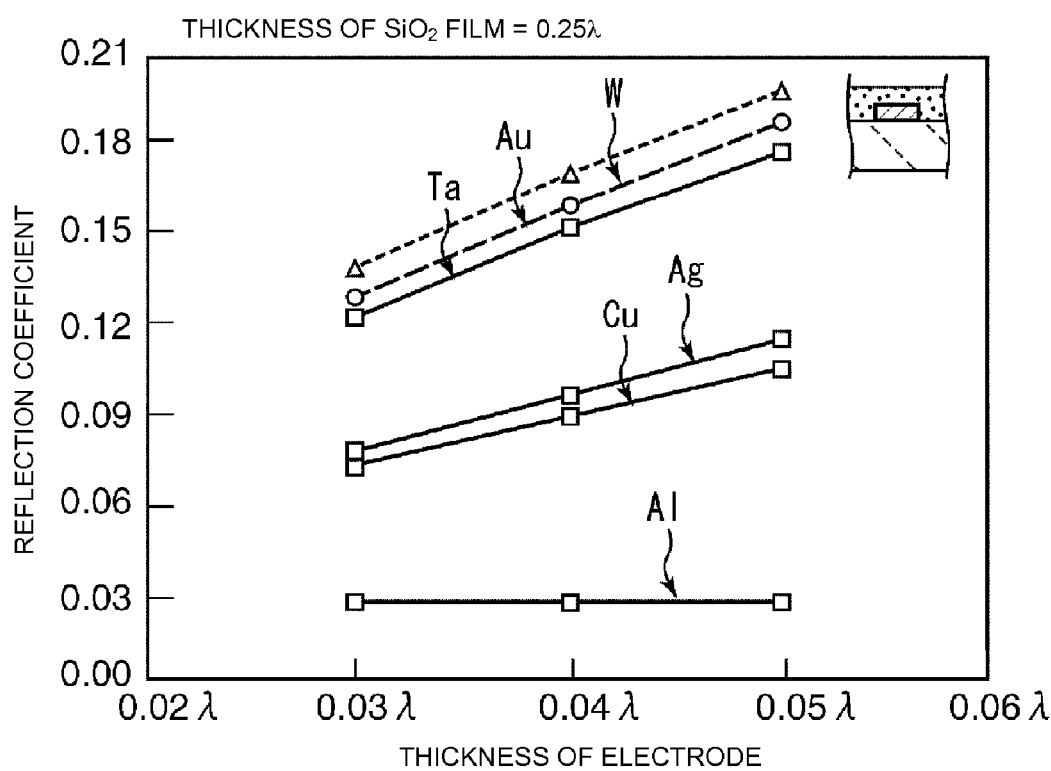
FIG. 35 shows a relationship between the thickness of an electrode and a reflection coefficient in a SAW device including a $SiO_2$ film having a thickness of about 0.25λ and a smooth upper surface placed on an electrode made of different metals placed on a $LiNbO_3$ substrate according to a preferred embodiment of the present invention.
Figure 36:
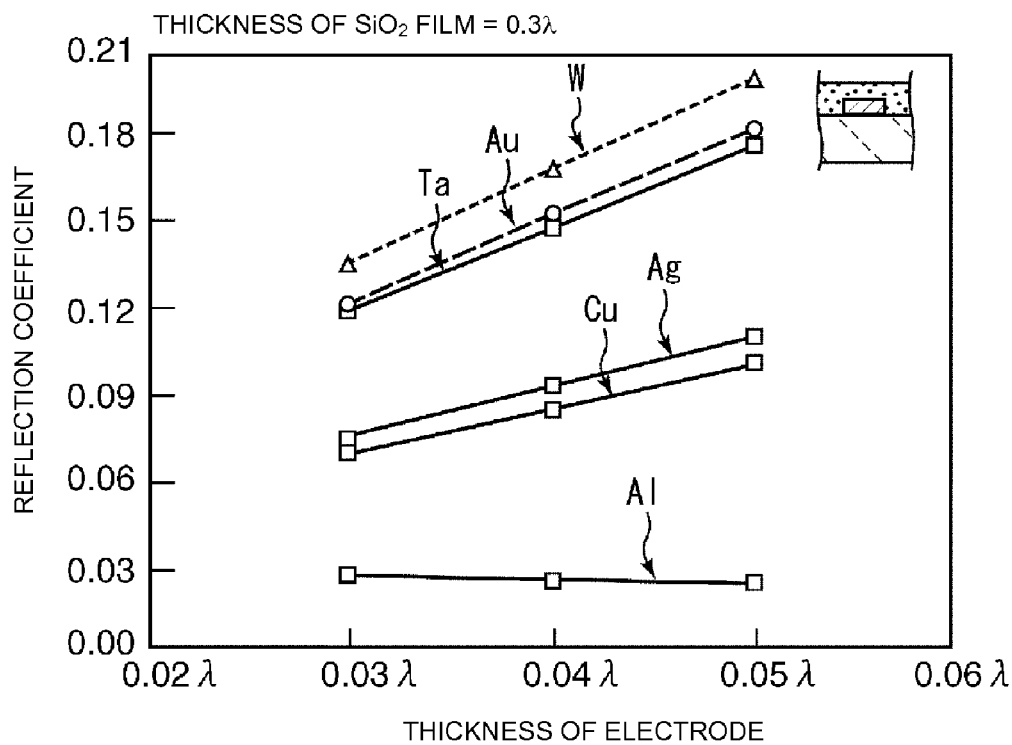
FIG. 36 shows a relationship between the thickness of an electrode and a reflection coefficient in a SAW device including a SiO$_2$ film having a thickness of about 0.3λ and a smooth upper surface placed on an electrode made of different metals placed on a LiNbO$_3$ substrate according to a preferred embodiment of the present invention.
Figure 37:
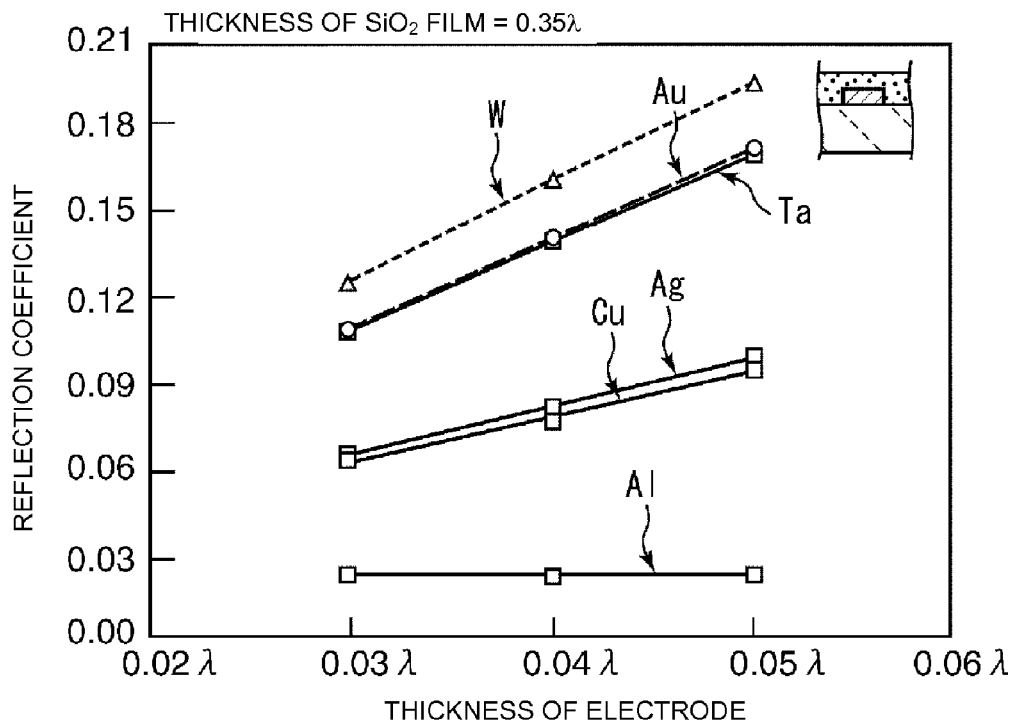
FIG. 37 shows a relationship between the thickness of an electrode and a reflection coefficient in a SAW device including a SiO$_2$ film having a thickness of about 0.35λ and a smooth upper surface placed on an electrode made of different metals placed on a LiNbO$_3$ substrate according to a preferred embodiment of the present invention.
Figure 38:
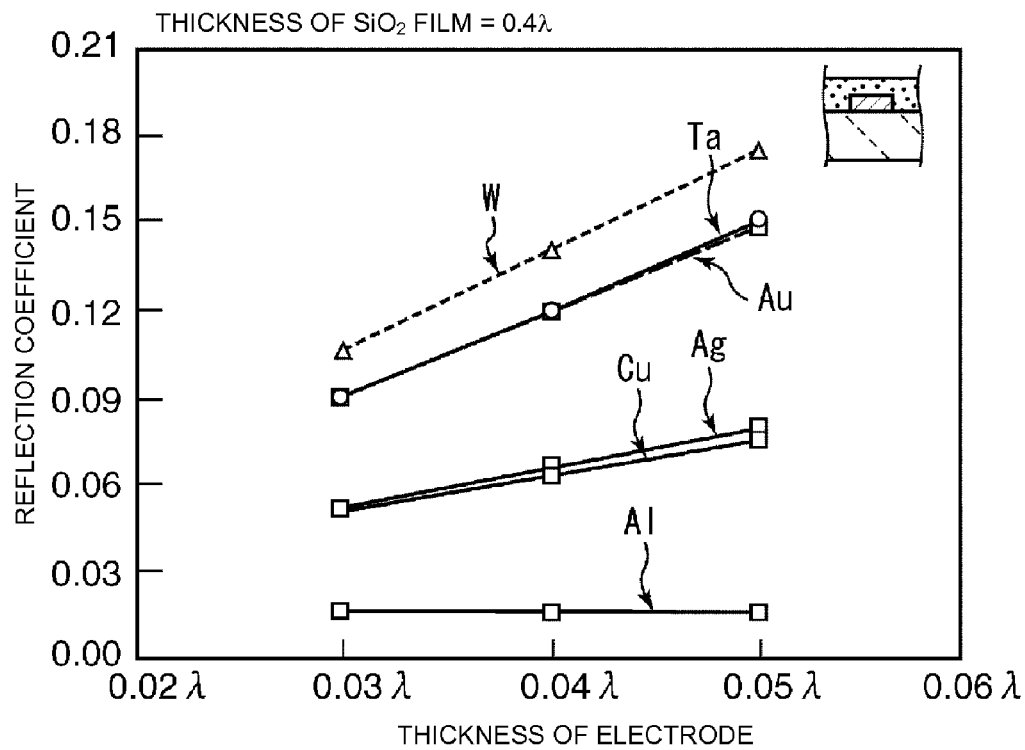
FIG. 38 shows a relationship between the thickness of an electrode and a reflection coefficient in a SAW device including a SiO$_2$ film having a thickness of about 0.4λ and a smooth upper surface placed on an electrode made of different metals placed on a LiNbO$_3$ substrate according to a preferred embodiment of the present invention.
Figure 39:
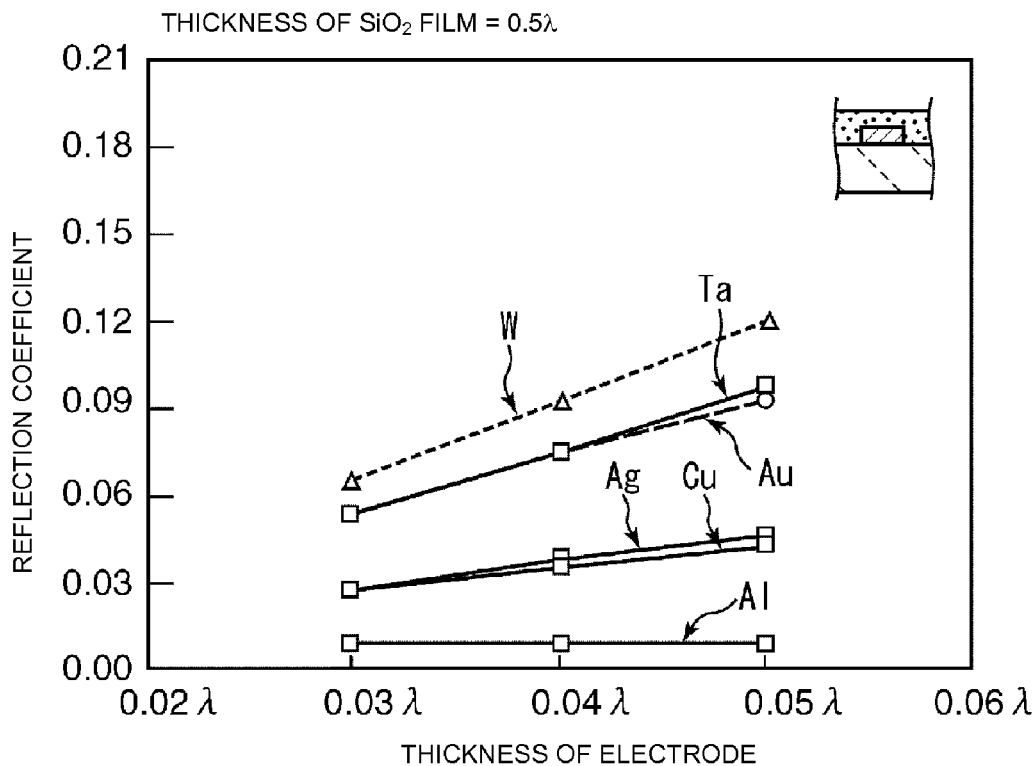
FIG. 39 shows a relationship between the thickness of an electrode and a reflection coefficient in a SAW device including a SiO$_2$ film having a thickness of about 0.5λ and a smooth upper surface placed on an electrode made of different metals placed on a LiNbO$_3$ substrate according to a preferred embodiment of the present invention.

As is clear from FIGS. 33A to 33E, the above-mentioned ripple A is shifted outside the band in FIGS. 33A to 33C. Particularly, the ripple A is significantly suppressed in FIG. 33A.

As can be understood from the results shown in FIGS. 33A to 33E, when the density of the laminated structure including the IDT electrode and the protective metal film is at least about 1.5 times greater than that of the first insulating layer, the ripple A are shifted outside the band between a resonance frequency and an antiresonance frequency, and thus, a favorable characteristic is obtained. More preferably, the ripple can be minimized when the density ratio is at least about 2.5:1.

In FIGS. 33A to 33E, the above-mentioned average density is used according to the above-described preferred embodiment because the Ti film is disposed on the IDT electrode 4A. In the present invention, however, the protective metal film need not always be provided on the IDT electrode 4A. In that case, the thickness of the IDT electrode 4A should be the same as that of the first insulating layer, and the density of the IDT electrode should be at least about 1.5 times (more preferably, more than 2.5 times) greater than that of the first insulating layer. It has been verified that the same advantages as those described above can be obtained with this structure.

Therefore, in the SAW resonator including the IDT electrode covered by the SiO$_2$ film, if the density of the IDT electrode or the average density of the laminated structure including the IDT electrode and the protective metal film is greater than the density of the first insulating layer that is disposed on side surfaces of the IDT electrode, the reflection coefficient of the IDT electrode is increased, and thus, degradation in characteristics between a resonance point and an antiresonance point is suppressed.

As a metal or an alloy having a higher density than that of Al, Ag, Au, or an alloy primarily including Ag or Au can be used as well as Cu.

Preferably, if the protective metal film is laminated on the IDT electrode as in the above-described preferred embodiment, corrosion of the IDT electrode 4A is prevented when the resist pattern 3 is removed because the side surfaces of the IDT electrode 4A are covered by the first insulating layer 2 and the upper surface thereof is covered by the protective metal film 5, as is clear from the manufacturing method shown in FIGS. 1A to 1G. Accordingly, a SAW resonator having more favorable characteristics is provided.

Alternatively, the first and second insulating layers may be formed by using an insulating material having a temperature characteristic improving effect other than SiO$_2$, such as SiO$_x$N$_y$. The first and second insulating layers may be made of either different insulating materials or the same material.

In the above-described preferred embodiment, the LiNbO$_3$ piezoelectric substrate 1 is preferably a LiNbO$_3$ substrate having an electromechanical coupling coefficient k of a SAW whose square is at least about 0.025. Accordingly, a SAW device having a wide bandwidth is provided.

The inventors of the present application examined a relationship between Euler angles and an electromechanical coupling coefficient by variously changing Euler angles of a LiNbO$_3$ substrate.

The temperature coefficient of frequency (TCF) of LiNbO$_3$ is negative: −80 to −110 ppm/°C., which is not very favorable. For improvement, a method for improving a TCF in a SAW device by forming a SiO$_2$ film having a positive TCF on a LiNbO$_3$ substrate is known.

Figure 3:
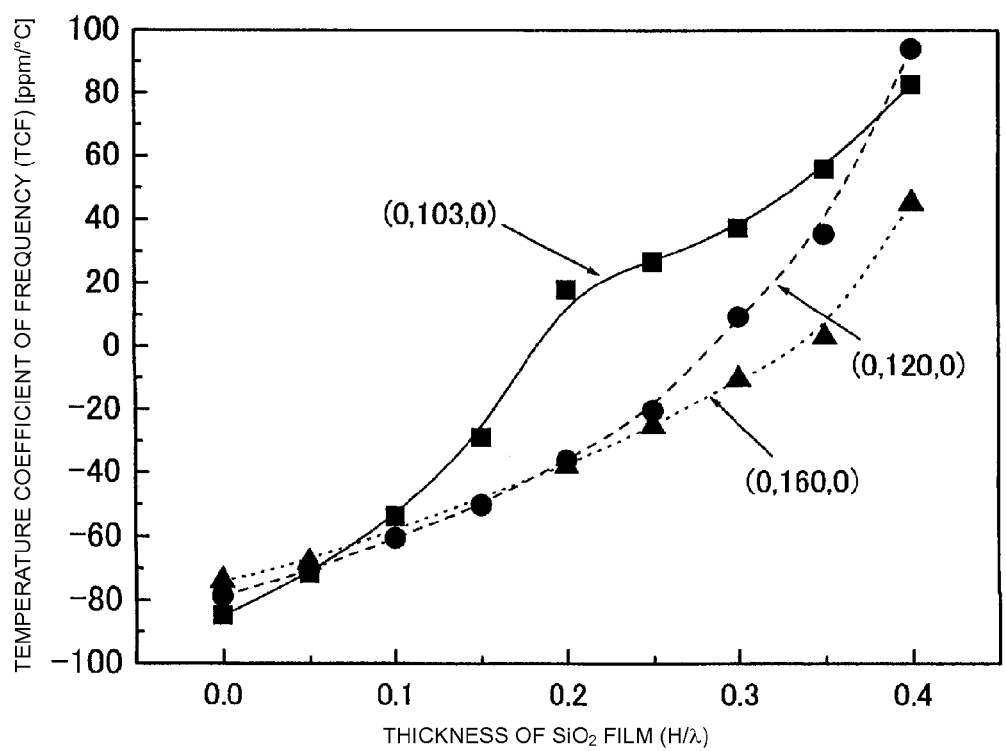
FIG. 3 shows a relationship between a thickness H/λ of a $SiO_2$ film and a temperature coefficient TCF when the $SiO_2$ film lies on a 13°, 30°, or 70°-rotated Y-cut X-propagating $LiNbO_3$ substrate.

As shown in FIG. 3, if a SiO$_2$ film is formed on a 13°-rotated Y-cut X-propagating (Euler angles of (0°, 103°, 0°)) LiNbO$_3$ substrate, an optimum thickness of the SiO$_2$ film is about 0.27$\lambda$ where the wavelength is $\lambda$. That is, the TCF is 0 (zero) when the thickness of the SiO$_2$ film is about 0.27$\lambda$. The optimum thickness of the SiO$_2$ film varies as the azimuth angle of the LiNbO$_3$ substrate changes. However, as is clear from FIG. 3, a temperature coefficient TCF of almost 0 (zero) is obtained when the thickness of the SiO$_2$ film is in the range of about 0.18$\lambda$ to about 0.34$\lambda$ to the wavelength.

Figure 4:
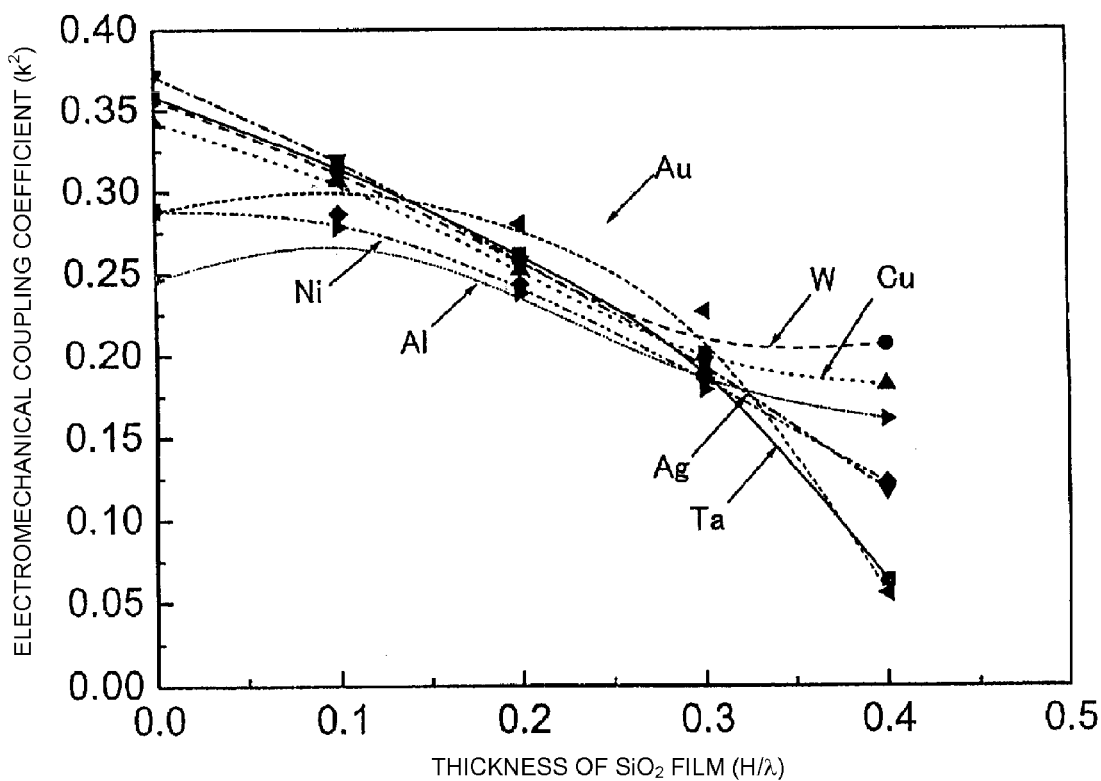
FIG. 4 shows a relationship between a normalized thickness H/λ of a $SiO_2$ film and an electromechanical coupling coefficient $k^2$ in a structure where an interdigital electrode and the $SiO_2$ film lie on a 13°-rotated Y-cut X-propagating $LiNbO_3$ substrate.
Figure 5:
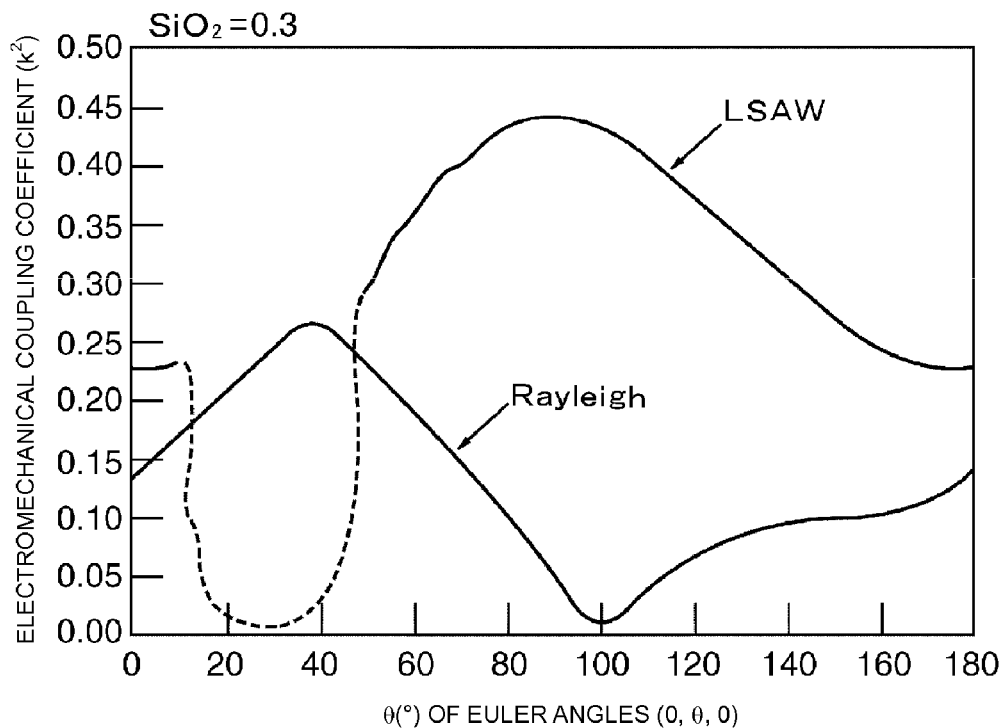
FIG. 5 shows a relationship between θ of Euler angles (φ, θ, ψ) of a $LiNbO_3$ substrate and electromechanical coupling coefficients of a Rayleigh wave and a LSAW.
Figure 6:
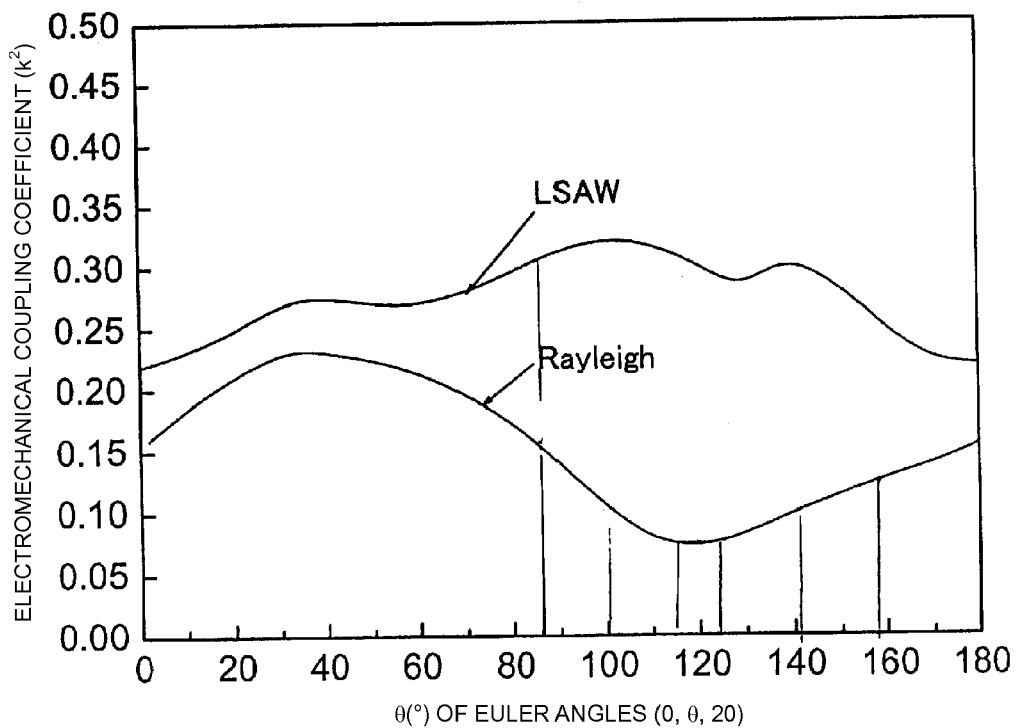
FIG. 6 shows a relationship between θ of Euler angles (φ, θ, ψ) of a $LiNbO_3$ substrate and electromechanical coupling coefficients of a Rayleigh wave and a LSAW.
Figure 7:
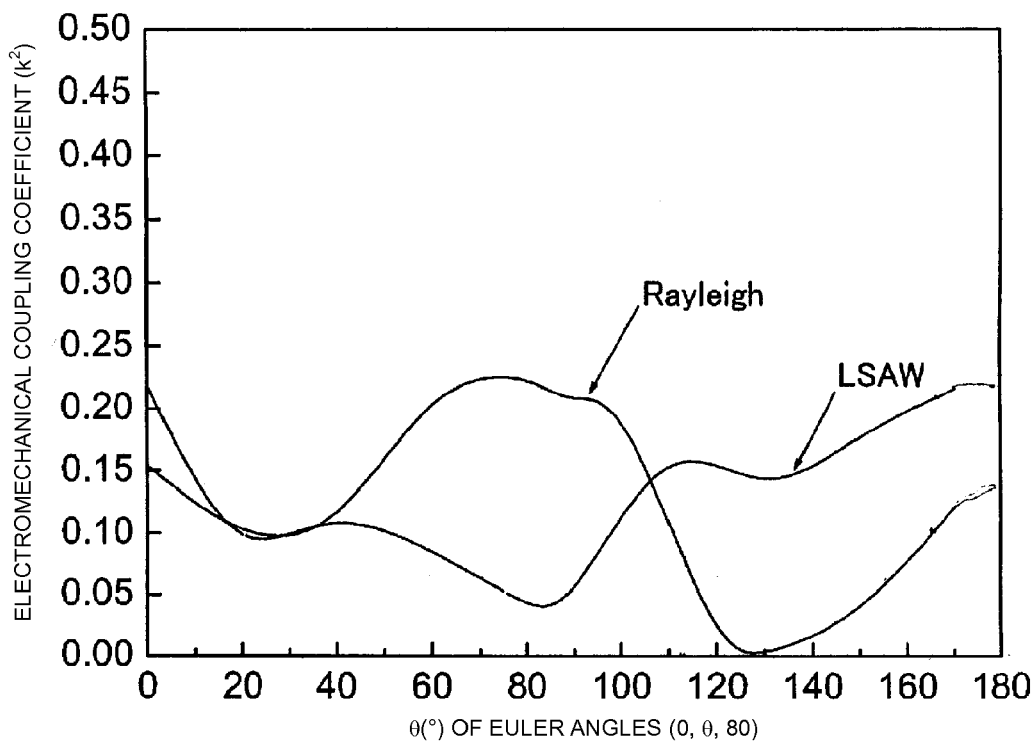
FIG. 7 shows a relationship between θ of Euler angles (φ, θ, ψ) of a $LiNbO_3$ substrate and electromechanical coupling coefficients of a Rayleigh wave and a LSAW.
Figure 8:
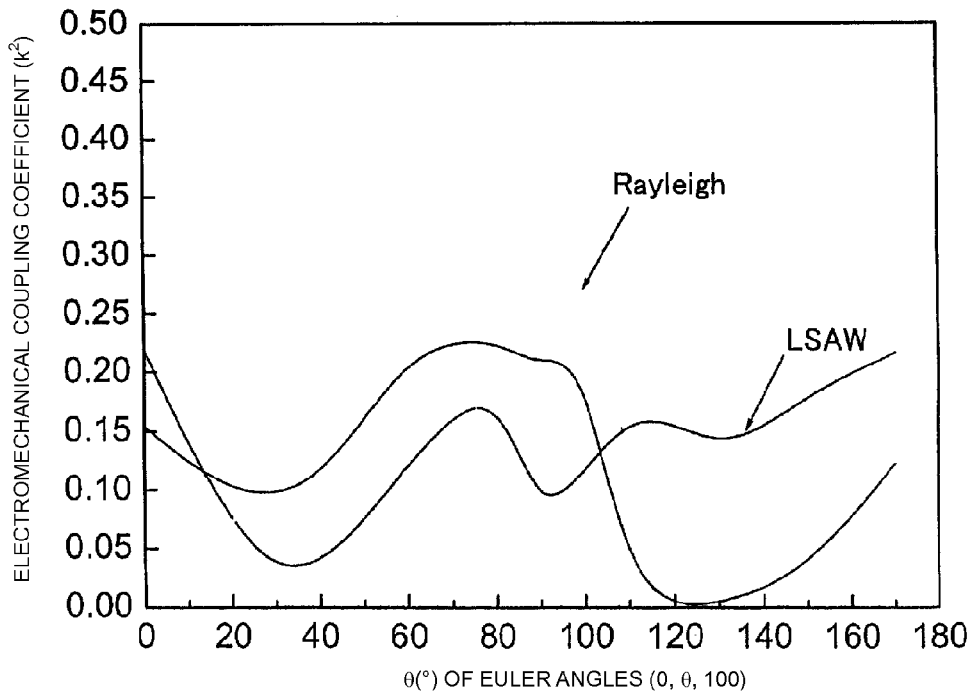
FIG. 8 shows a relationship between θ of Euler angles (φ, θ, ψ) of a $LiNbO_3$ substrate and electromechanical coupling coefficients of a Rayleigh wave and a LSAW.
Figure 9:
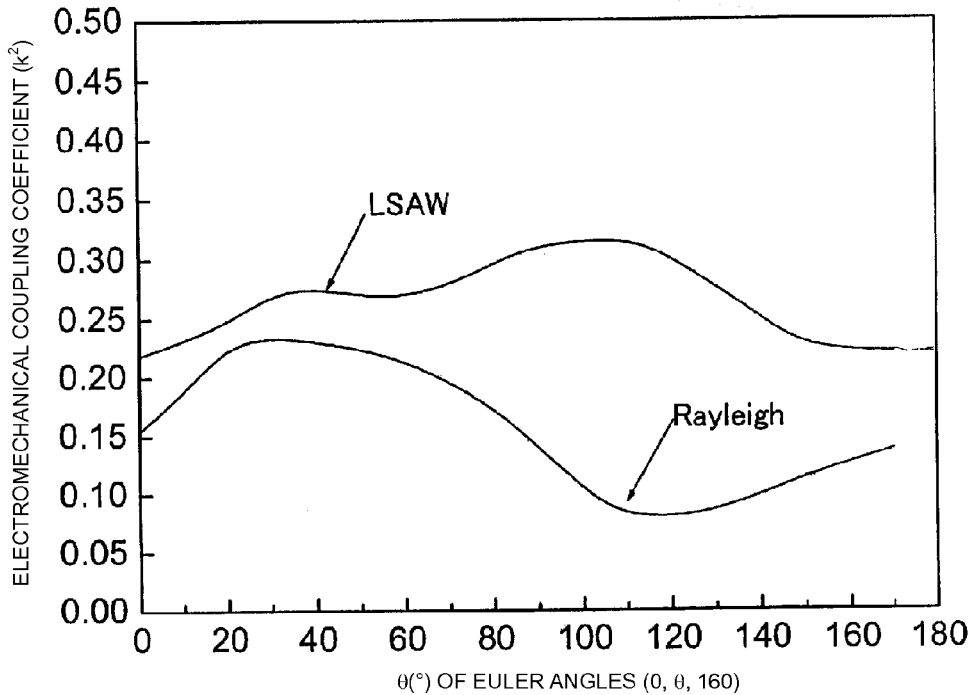
FIG. 9 shows a relationship between θ of Euler angles (φ, θ, ψ) of a $LiNbO_3$ substrate and electromechanical coupling coefficients of a Rayleigh wave and a LSAW.
Figure 10:
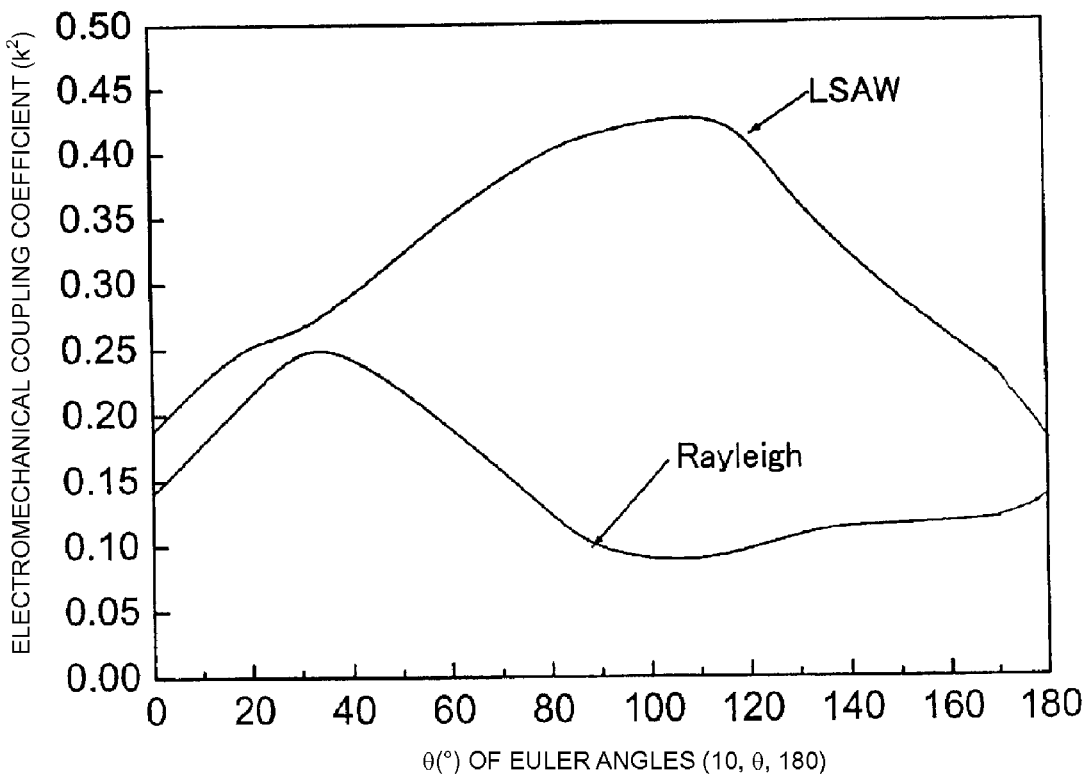
FIG. 10 shows a relationship between θ of Euler angles (φ, θ, ψ) of a $LiNbO_3$ substrate and electromechanical coupling coefficients of a Rayleigh wave and a LSAW.
Figure 11:
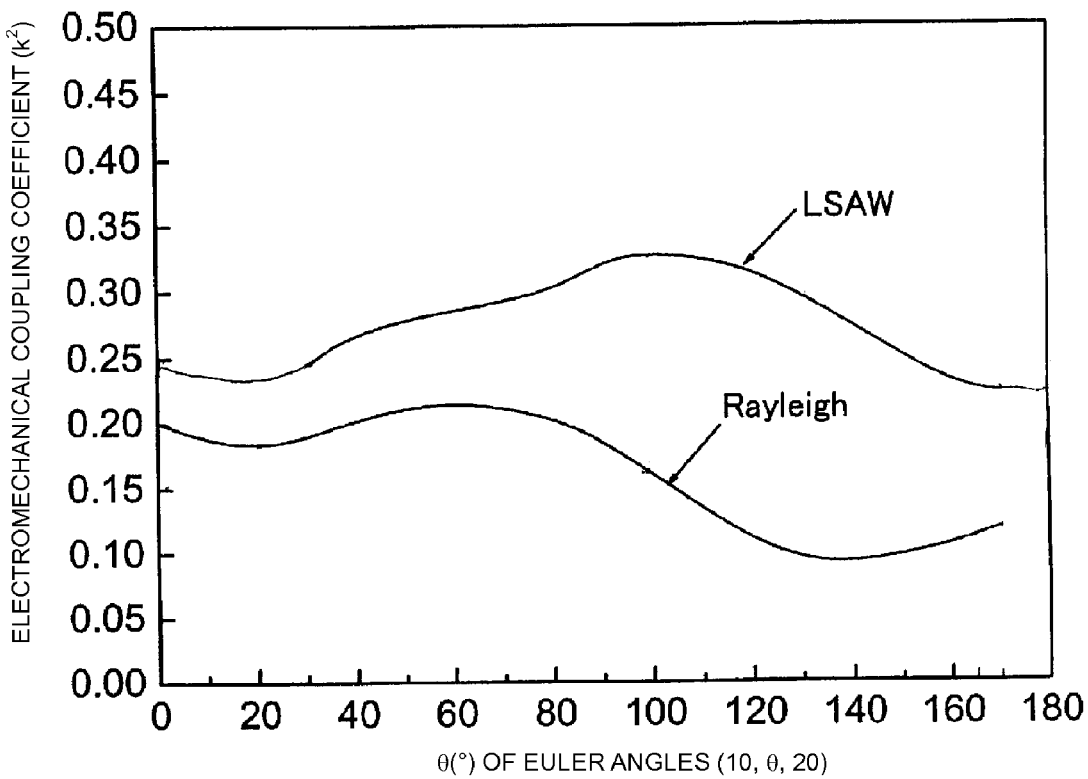
FIG. 11 shows a relationship between θ of Euler angles (φ, θ, ψ) of a $LiNbO_3$ substrate and electromechanical coupling coefficients of a Rayleigh wave and a LSAW.
Figure 12:
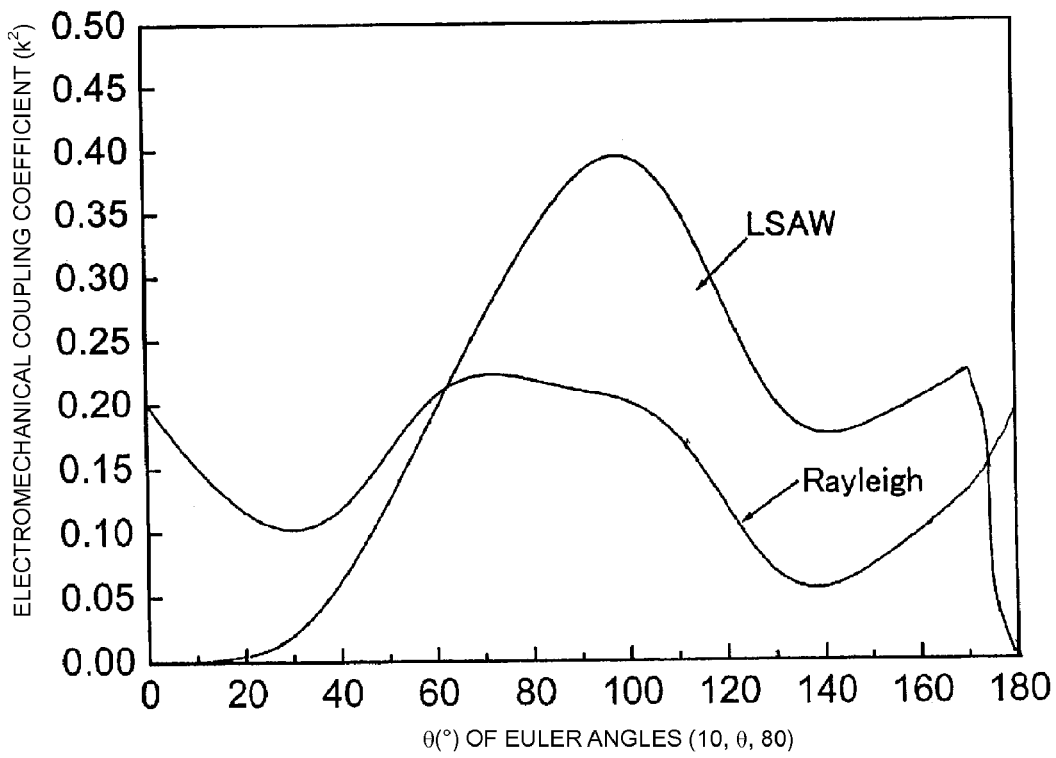
FIG. 12 shows a relationship between θ of Euler angles (φ, θ, ψ) of a $LiNbO_3$ substrate and electromechanical coupling coefficients of a Rayleigh wave and a LSAW.
Figure 13:
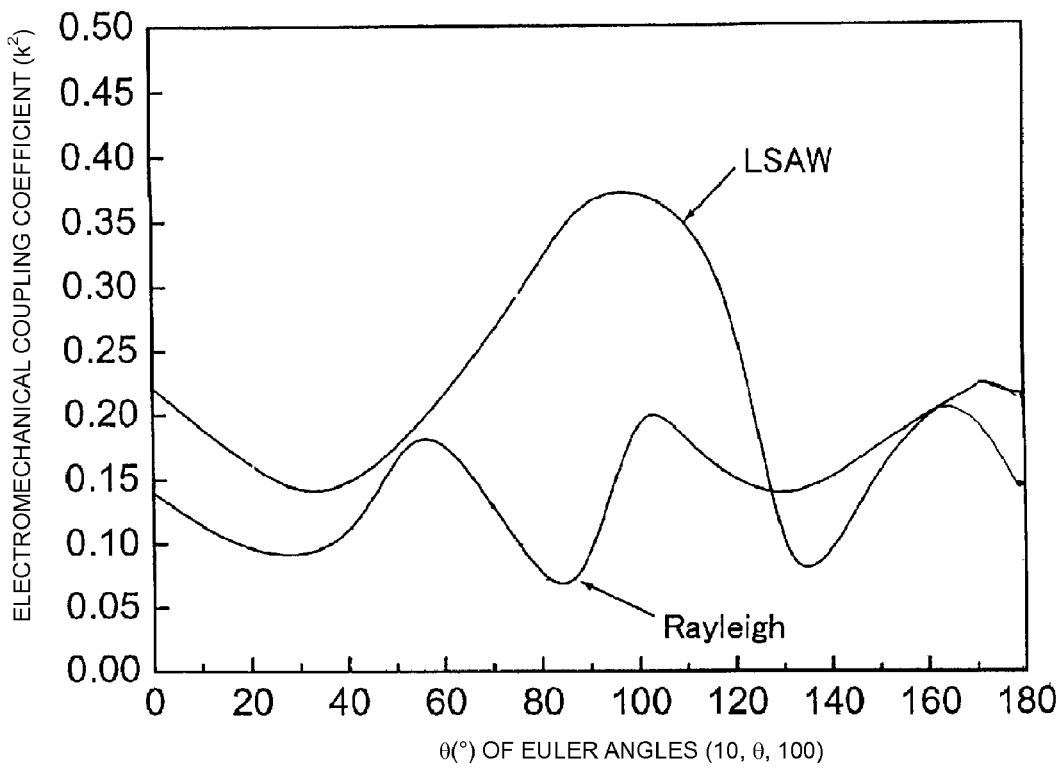
FIG. 13 shows a relationship between θ of Euler angles (φ, θ, ψ) of a $LiNbO_3$ substrate and electromechanical coupling coefficients of a Rayleigh wave and a LSAW.
Figure 14:
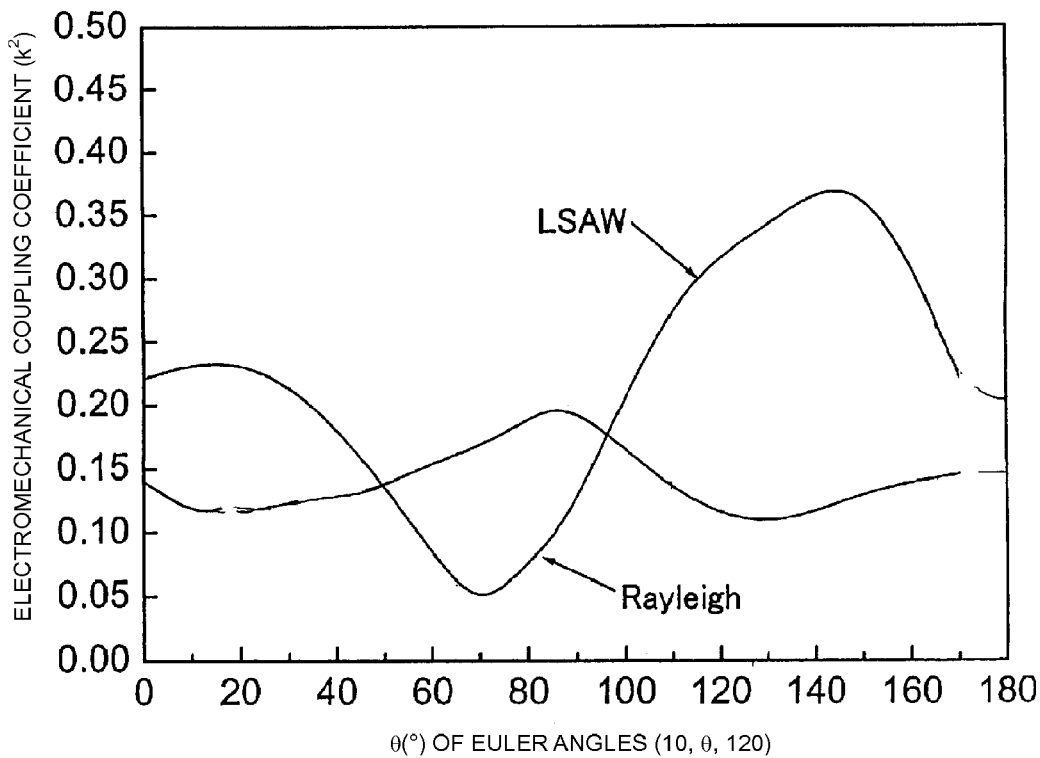
FIG. 14 shows a relationship between θ of Euler angles (φ, θ, ψ) of a $LiNbO_3$ substrate and electromechanical coupling coefficients of a Rayleigh wave and a LSAW.
Figure 15:
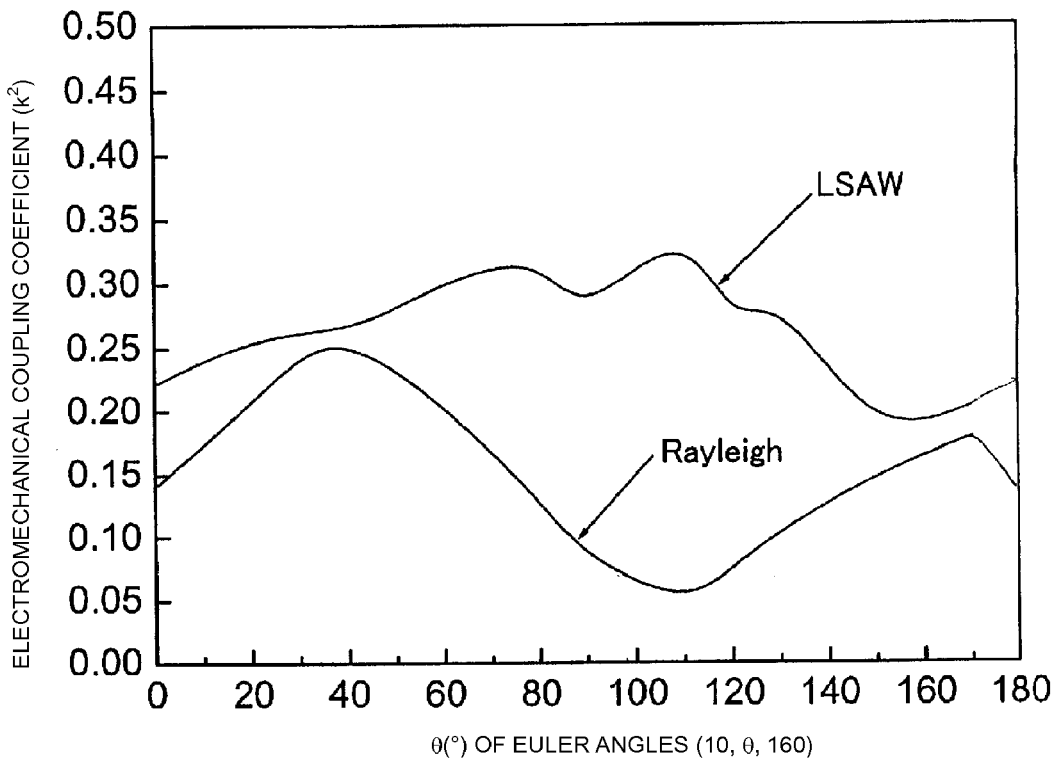
FIG. 15 shows a relationship between θ of Euler angles (φ, θ, ψ) of a $LiNbO_3$ substrate and electromechanical coupling coefficients of a Rayleigh wave and a LSAW.
Figure 16:
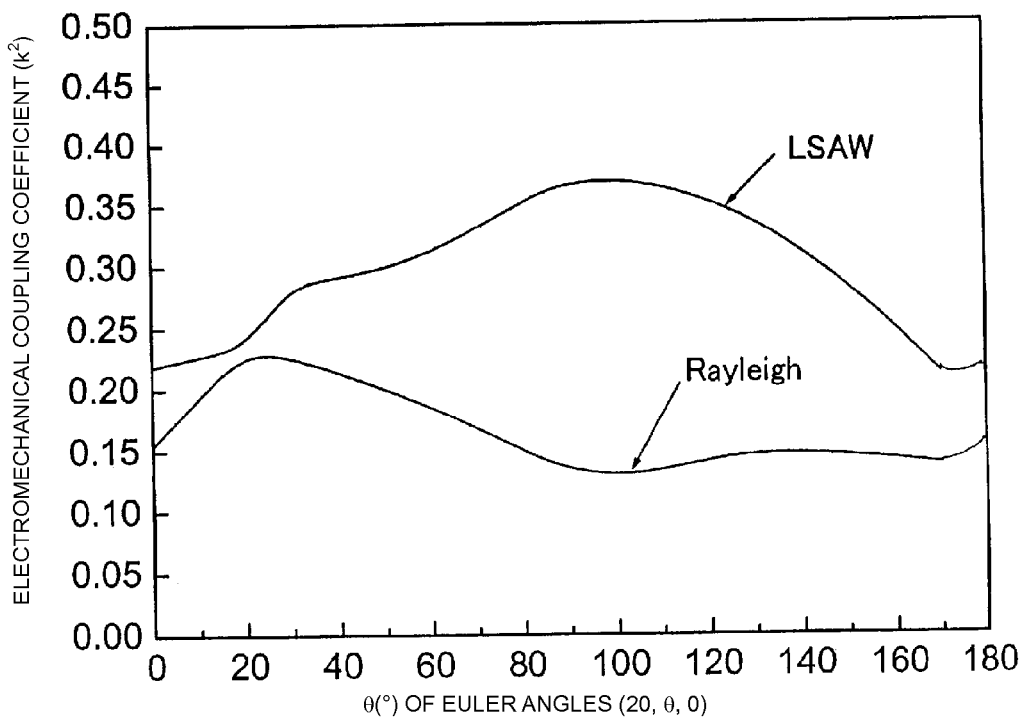
FIG. 16 shows a relationship between θ of Euler angles (φ, θ, ψ) of a $LiNbO_3$ substrate and electromechanical coupling coefficients of a Rayleigh wave and a LSAW.
Figure 17:
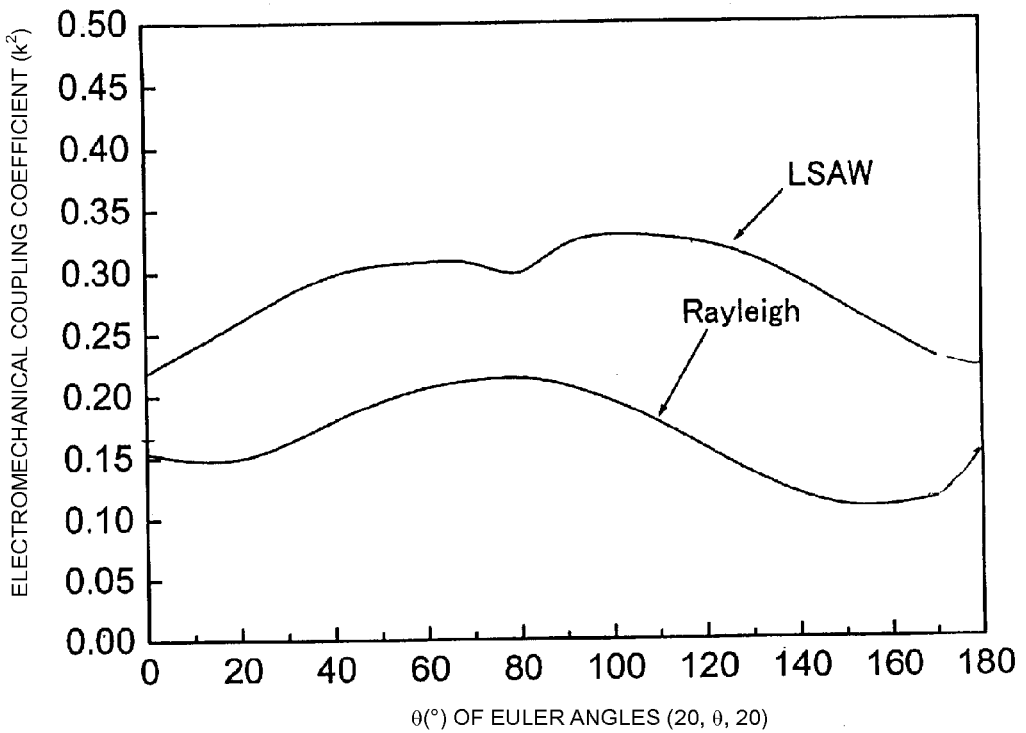
FIG. 17 shows a relationship between θ of Euler angles (φ, θ, ψ) of a $LiNbO_3$ substrate and electromechanical coupling coefficients of a Rayleigh wave and a LSAW.
Figure 18:
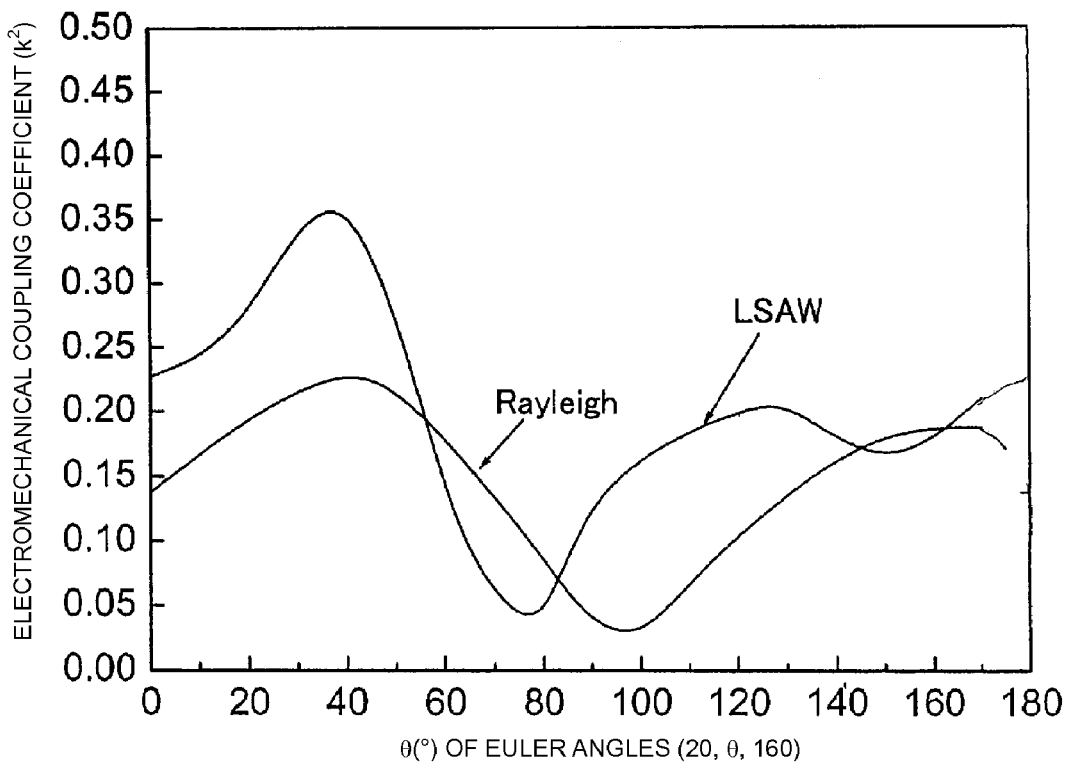
FIG. 18 shows a relationship between θ of Euler angles (φ, θ, ψ) of a $LiNbO_3$ substrate and electromechanical coupling coefficients of a Rayleigh wave and a LSAW.
Figure 19:
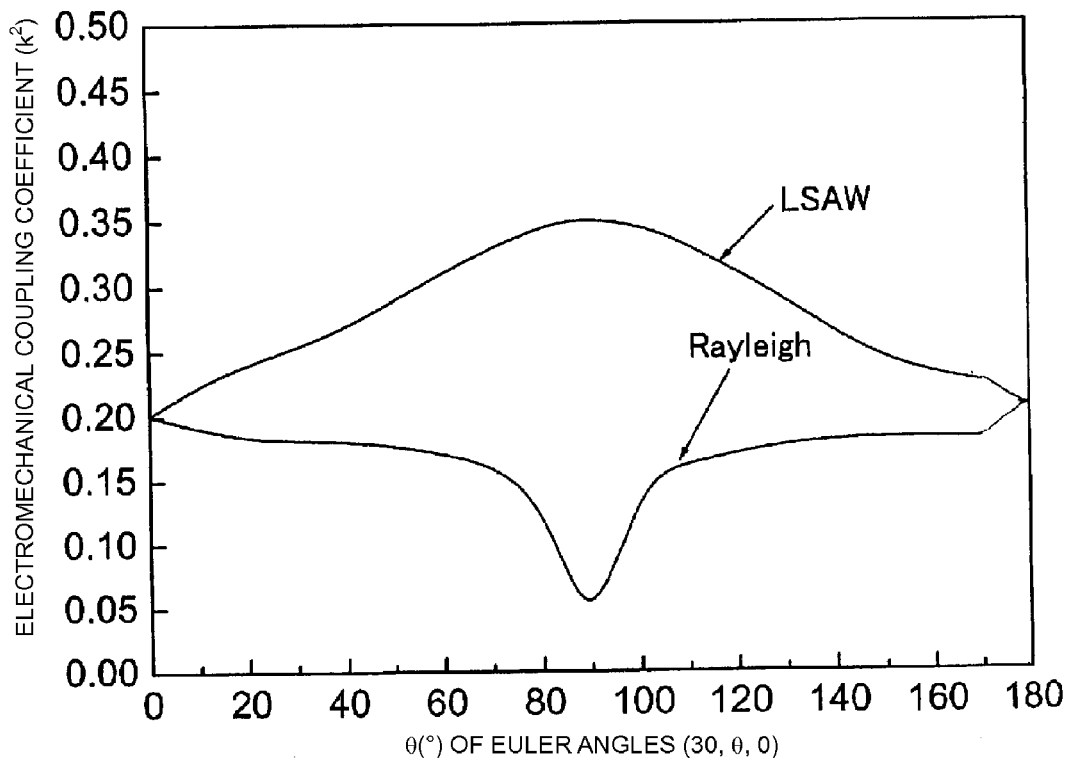
FIG. 19 shows a relationship between θ of Euler angles (φ, θ, ψ) of a $LiNbO_3$ substrate and electromechanical coupling coefficients of a Rayleigh wave and a LSAW.
Figure 20:
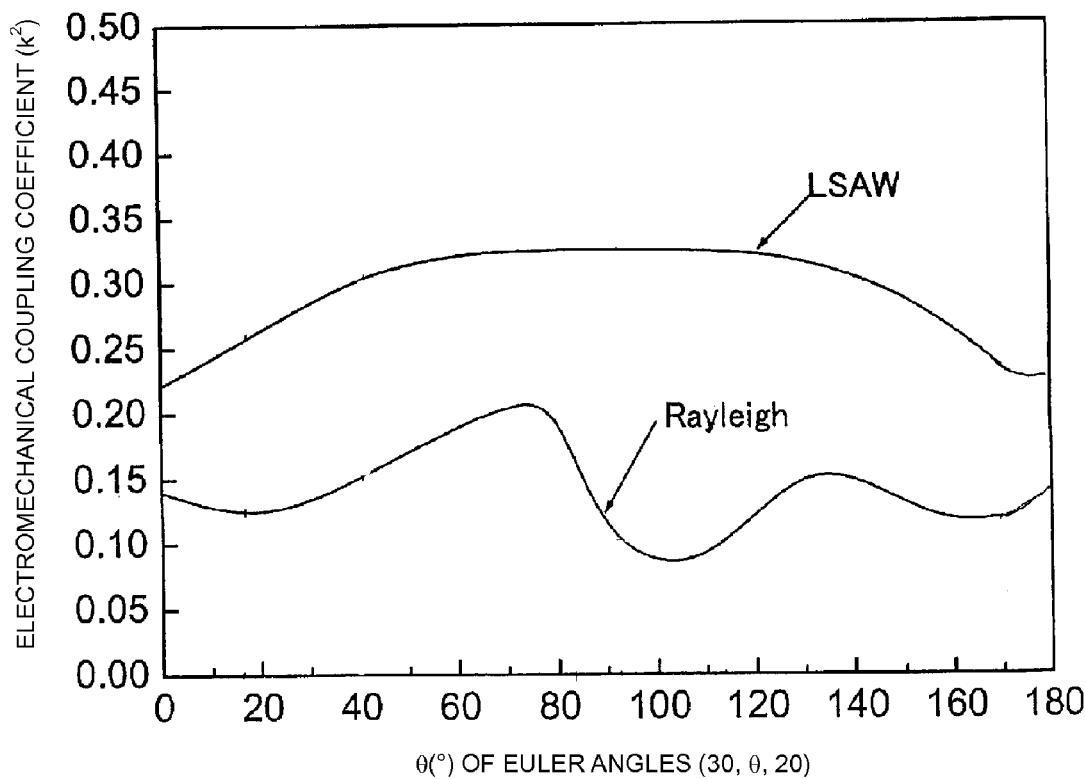
FIG. 20 shows a relationship between θ of Euler angles (φ, θ, ψ) of a $LiNbO_3$ substrate and electromechanical coupling coefficients of a Rayleigh wave and a LSAW.
Figure 21:
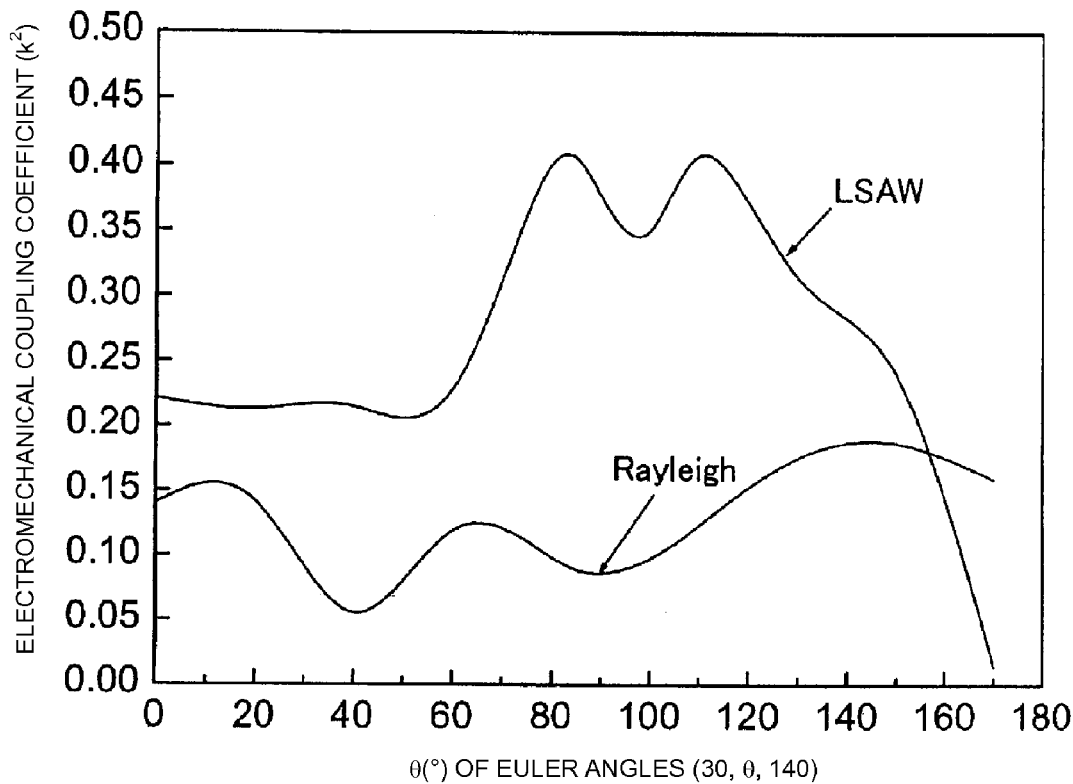
FIG. 21 shows a relationship between θ of Euler angles (φ, θ, ψ) of a $LiNbO_3$ substrate and electromechanical coupling coefficients of a Rayleigh wave and a LSAW.
Figure 22:
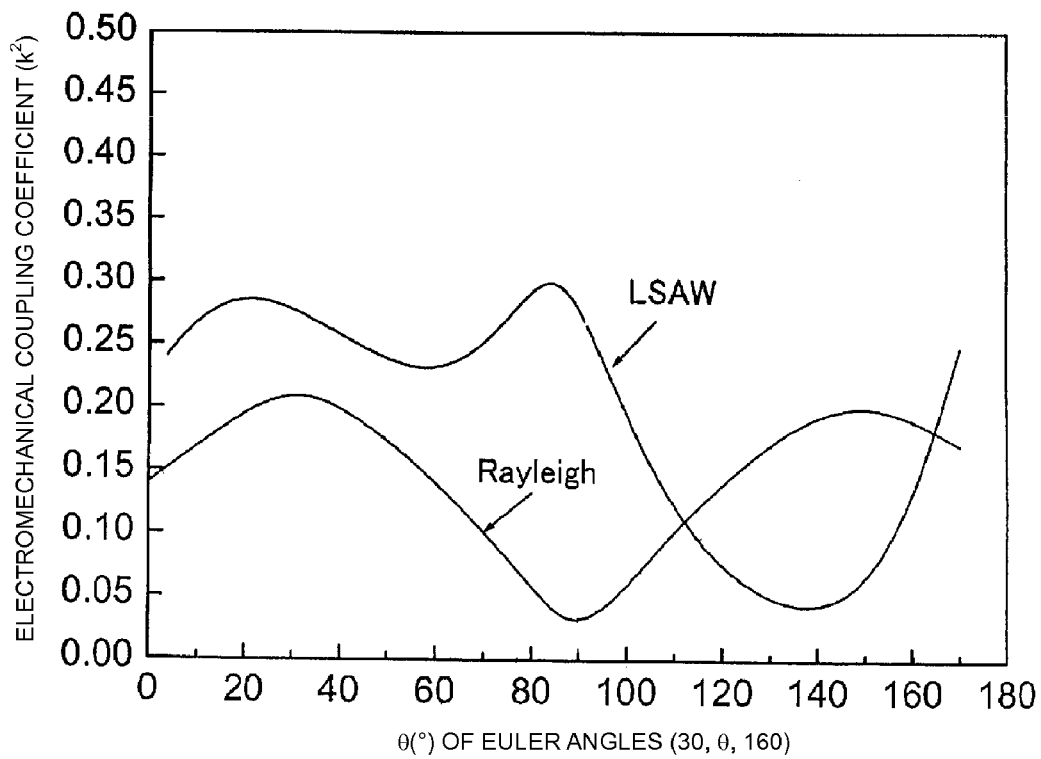
FIG. 22 shows a relationship between θ of Euler angles (φ, θ, ψ) of a $LiNbO_3$ substrate and electromechanical coupling coefficients of a Rayleigh wave and a LSAW.

On the other hand, FIG. 4 shows a relationship between a normalized thickness H/$\lambda$ of a SiO$_2$ film and an electromechanical coupling coefficient k$^2$ in a structure where an IDT electrode and a SiO$_2$ film are disposed on a 13°-rotated Y-cut X-propagating LiNbO$_3$ substrate. FIG. 4 shows results obtained in respective IDT electrodes of a about 0.005$\lambda$ to about 0.01$\lambda$ thickness made of various metallic materials.

As shown in FIG. 4, the electromechanical coupling coefficient k$^2$ is decreases as the thickness H/$\lambda$ of the SiO$_2$ film increases. Thus, the SiO$_2$ film should be as thin as possible.

As described above, and as shown in FIGS. 3 and 4, the thickness of the SiO$_2$ film is preferably in the range of about 0.2$\lambda$ to about 0.35$\lambda$, when both the temperature coefficient of frequency TCF and the electromechanical coupling coefficient k$^2$ are considered.

Where the thickness of the SiO$_2$ film is about 0.3$\lambda$, a relationship between θ of Euler angles and an electromechanical coupling coefficient of a Rayleigh wave was examined in LiNbO$_3$ substrates of different Euler angles. The results are shown in FIGS. 5 to 22.

It is known that a leaky surface acoustic wave (LSAW) is difficult to generate when θ of Euler angles (0, θ, 0) is in the range of about 20° to about 40°. When a thin SiO$_2$ film is disposed on the upper surface of an IDT electrode, a LSAW portion of a low electromechanical coupling coefficient ranges from about 20° to about 40° of θ of Euler angles (0, θ, 0), as indicated with the dotted line shown in FIG. 5.

In general, an electromechanical coupling coefficient $k^2$ required in a RF filter or a duplexer is at least about 0.025. In addition, if a LSAW is used, the spurious of a Rayleigh wave must be small. That is, when the electromechanical coupling coefficient of a Rayleigh wave is $k_R^2$ and when the electromechanical coupling coefficient of a LSAW is $k_{LSAW}^2$, $(K_{LSAW}^2/4) \geq k_R^2$ must be satisfied.

Table 7 shows the ranges of Euler angles that satisfy such a range. Since LiNbO₃ is a crystal of trigonal system, Euler angles have the following relationship:

(φ, θ, ψ)=(60+φ, −θ, ψ)=(60−φ, −θ, 180−ψ)=(φ, 180+θ, 180−ψ)=(φ, θ, 180+ψ).

Thus, for example, Euler angles (10, 30, 10) are equivalent to Euler angles (70, −30, 10), (50, −30, 170), (10, 210, 170), and (10, 30, 190).

TABLE 7

| | LSAW | | Rayleigh | |
|---|---|---|---|---|
| Euler angles | k | $k^2$ | k | $k^2$ |
| (0 ± 5, 62~167, 0 ± 10) | 0.22~0.43 | 0.0484~0.1849 | 0.02~0.17 | 0.0004~0.0289 |
| (0 ± 5, 87~158, 20 ± 10) | 0.24~0.32 | 0.0576~0.1024 | 0.07~0.16 | 0.0049~0.0256 |
| (0 ± 5, 112~165, 80 ± 10) | 0.16~0.22 | 0.0256~0.0484 | 0.01~0.10 | 0.0001~0.01 |
| (0 ± 5, 107~167, 100 ± 10) | 0.16~0.21 | 0.0256~0.0441 | 0.01~0.10 | 0.0001~0.01 |
| (10 ± 5, 110~162, 80 ± 10) | 0.17~0.39 | 0.0289~0.1521 | 0.05~0.17 | 0.0025~0.0289 |
| (10 ± 5, 69~108, 100 ± 10) | 0.27~0.37 | 0.0729~0.1369 | 0.07~0.18 | 0.0049~0.0324 |
| (10 ± 5, 72~140, 160 ± 10) | 0.24~0.32 | 0.0576~0.1024 | 0.06~0.15 | 0.0036~0.0225 |
| (20 ± 5, 99~121, 160 ± 10) | 0.16~0.20 | 0.0256~0.04 | 0.03~0.11 | 0.0009~0.0121 |
| (30 ± 5, 67~113, 0 ± 10) | 0.32~0.35 | 0.1024~0.1225 | 0.06~0.17 | 0.0036~0.0289 |
| (30 ± 5, 27~125, 140 ± 10) | 0.21~0.41 | 0.0441~0.1681 | 0.05~0.17 | 0.0025~0.0289 |
| (30 ± 5, 67~103, 160 ± 10) | 0.16~0.30 | 0.0256~0.09 | 0.03~0.10 | 0.0009~0.01 |

Preferably, the Euler angles should be in the ranges shown in Table 8. In this case, the electromechanical coupling coefficient $k_R^2$ of a Rayleigh wave is about 0.01 or less.

TABLE 8

$k_R^2 \leq 0.01$ (0 ± 5, 80~160, 0 ± 10)
(0 ± 5, 100~142, 0 ± 10)
(0 ± 5, 112~165, 80 ± 10)
(0 ± 5, 107~167, 100 ± 10)
(10 ± 5, 123~158, 80 ± 10)
(10 ± 5, 74~90, 100 ± 10)
(10 ± 5, 87~128, 160 ± 10)
(20 ± 5, 99~119, 160 ± 10)
(30 ± 5, 82~98, 0 ± 10)
(30 ± 5, 28~53, 140 ± 10)
(30 ± 5, 70~103, 160 ± 10)

More preferably, the Euler angles should be in the ranges shown in Table 9. In this case, $k_R^2$ is about 0.049 or less.

TABLE 9

$k_R^2 \leq 0.049$ (0 ± 5, 88~117, 0 ± 10)
(0 ± 5, 115~124, 0 ± 10)
(0 ± 5, 115~135, 80 ± 10)
(0 ± 5, 109~157, 100 ± 10)
(10 ± 5, 130~146, 80 ± 10)
(10 ± 5, 80~87, 100 ± 10)
(10 ± 5, 98~118, 160 ± 10)
(20 ± 5, 110~118, 160 ± 10)

TABLE 9-continued $k_R^2 \leq 0.049$ (30 ± 5, 86~94, 0 ± 10)
(30 ± 5, 33~47, 140 ± 10)
(30 ± 5, 77~103, 160 ± 10)

Figure 23:
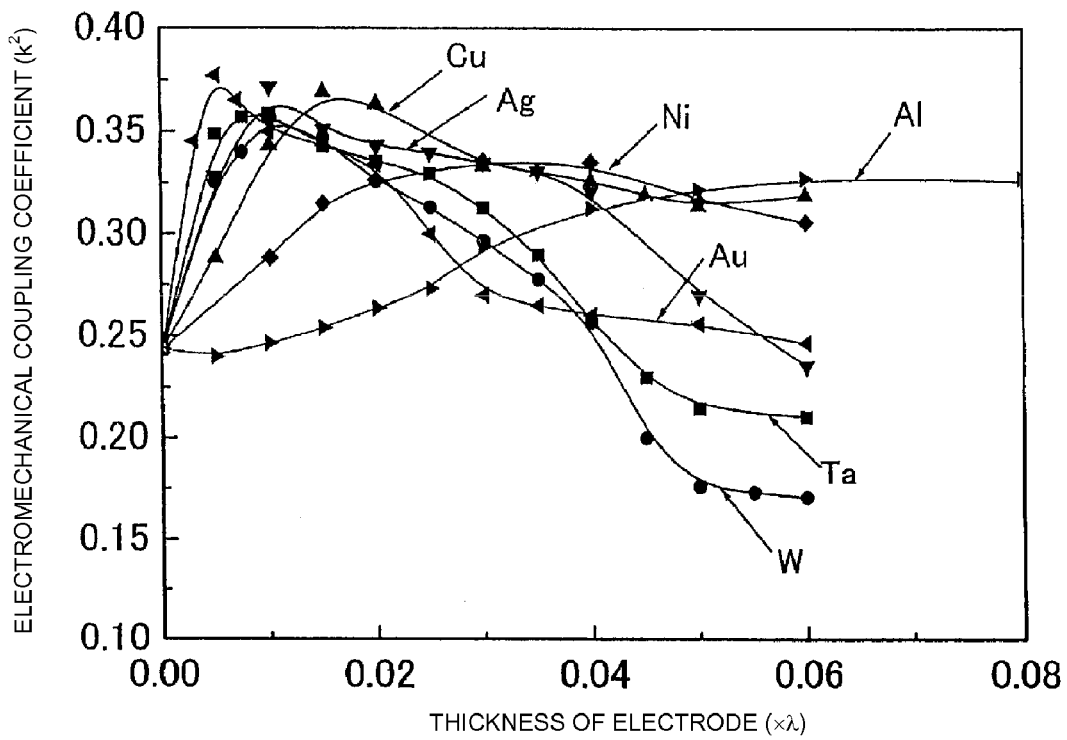
FIG. 23 shows a relationship between a thickness of an electrode and an electromechanical coupling coefficient $k^2$ in electrodes made of different metals lying on a 13°-rotated Y-cut X-propagating $LiNbO_3$ substrate.

FIG. 23 shows electromechanical coupling coefficients $k^2$ in electrodes made of various metallic materials disposed on a 13°-rotated Y-cut X-propagating LiNbO₃ substrate. As is clear from FIG. 23, the electromechanical coupling coefficient $k^2$ changes in accordance with changes in thickness of the electrode. It has been verified that the thickness of the electrode required to obtain a $k^2$ of about 1.25 times greater than $k^2$ when the electrode is not formed is in the range of about 0.0017 to about 0.03 to the wave length, if the electrode is made of Au. Although not shown in FIG. 23, the range of thickness is the same in an electrode made of Pt. The range is about 0.0035 to about 0.05 in Ag, about 0.0025 to about 0.032 in Ta, about 0.0035 to about 0.03 in W, about 0.0058 to about 0.055 in Cu, about 0.125 to about 0.08 in Ni, about 0.033 to about 0.12 in Al, and about 0.012 to about 0.12 in Cr, Ti, Mo, or Zn.

The upper limit of the above-described range of the thickness of an electrode is limited by the accuracy of forming an interdigital electrode. That is, it is difficult to form an interdigital electrode having a thickness greater than the above-described thickness with high accuracy.

The optimum thickness of an electrode differs depending on the Euler angles of a LiNbO₃ substrate. However, the maximum of the optimum thickness is, at most, about twice the minimum thickness.

Since the upper limit of the thickness of an electrode is about 0.12λ in Al, the optimum thickness of the electrode is about 0.0017λ to about 0.06λ in Au, about 0.0017λ to about 0.06λ in Pt, about 0.0035λ to about 0.10λ in Ag, about 0.0025λ to about 0.064λ in Ta, about 0.0035λ to about 0.06λ in W, about 0.0058λ to about 0.11λ in Cu, about 0.012λ to about 0.12λ in Ni, and about 0.033λ to about 0.12λ in Al.

Figure 24:
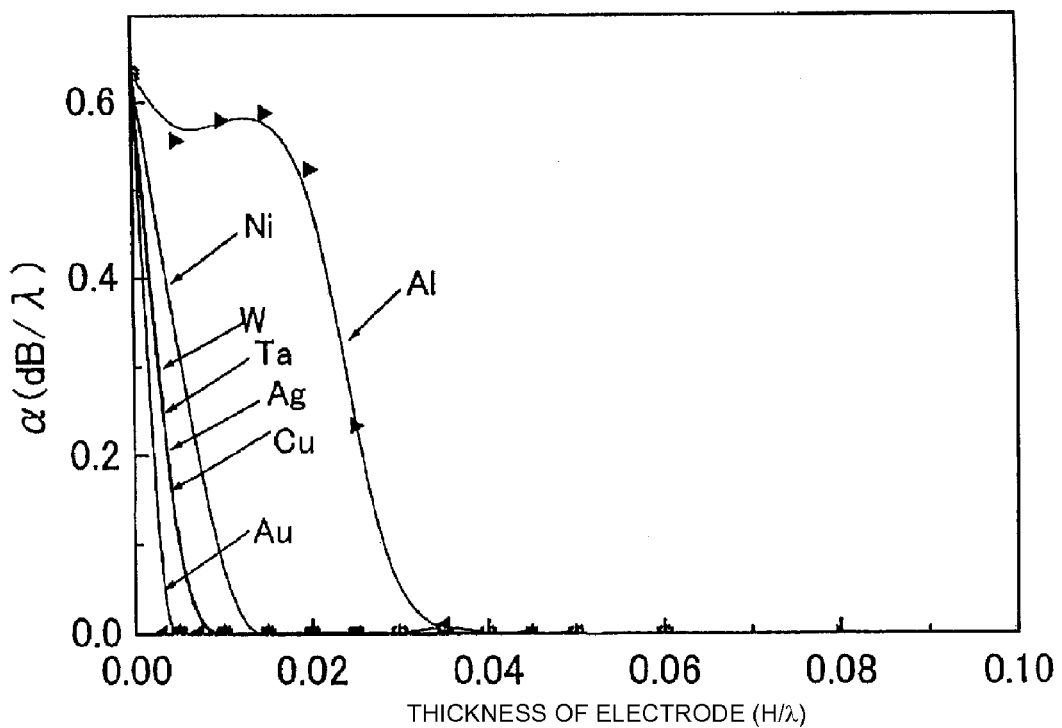
FIG. 24 shows a relationship between a thickness of an electrode and an attenuation constant α in electrodes made of different metals lying on a 13°-rotated Y-cut X-propagating $LiNbO_3$ substrate.

FIG. 24 shows changes in propagation constant relative to the thickness of an electrode in SAW devices including electrodes of different materials with the above-described optimum thickness. As is clear from FIG. 24, the propagation loss is substantially 0 (zero) in these thicknesses.

Figure 25:
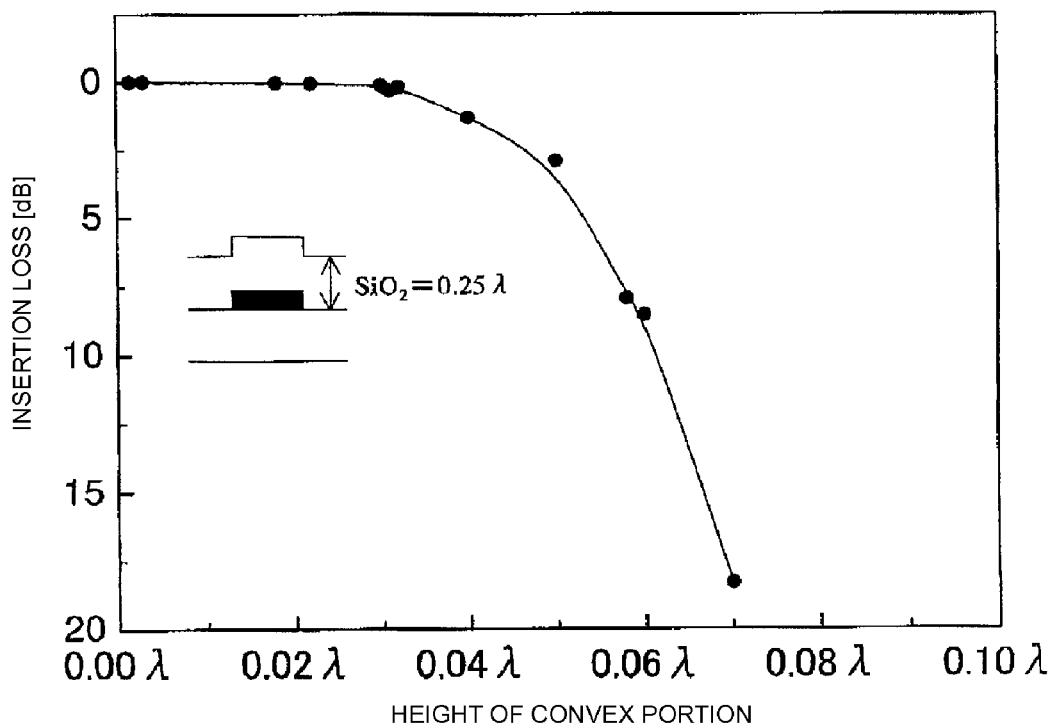
FIG. 25 shows a relationship between a height of a convex portion on a surface of a $SiO_2$ film and insertion loss.

When the first and second insulating layers are made of $SiO_2$, in other words, when a $SiO_2$ film is formed to cover an interdigital electrode, as shown in FIGS. 1 and 2, a convex portion is generated on the upper surface of the $SiO_2$ film due to the shape of the interdigital electrode. If the convex portion is large, that is, if the convex on the surface of the second insulating layer 6 is high, the characteristics of the SAW device degrade. FIG. 25 shows changes in insertion loss according to changes in height of the convex portion on the surface of the $SiO_2$ film. As is clear from FIG. 25, the insertion loss is suppressed if the height of the convex portion is about $0.03\lambda$ or less.

The height of the convex portion on the surface of the $SiO_2$ film is a distance from the bottom to the top of the convex portion.

Figure 26:
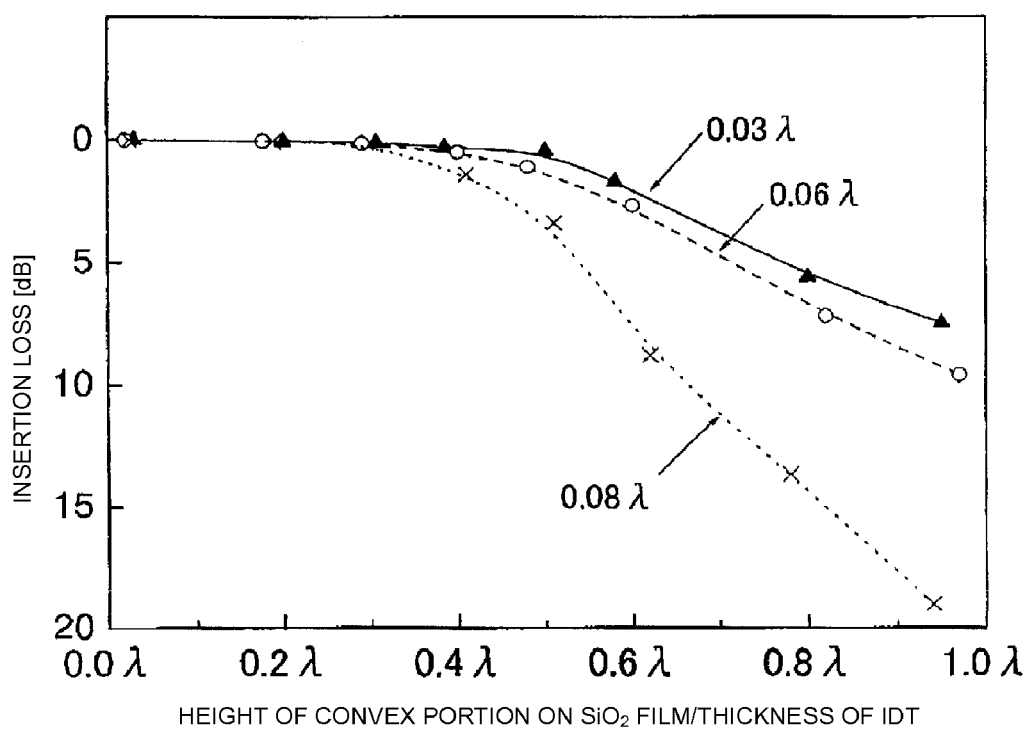
FIG. 26 shows a relationship between a ratio of a height of a convex portion on a surface of a $SiO_2$ film to a thickness of an interdigital electrode and insertion loss.

FIG. 26 shows changes in insertion loss when the ratio between the height of the convex portion on the surface of the $SiO_2$ film and the thickness of the interdigital electrode is varied. As shown in FIG. 26, white circles indicate the case where the normalized film thickness $H/\lambda$ of the IDT is about $0.06\lambda$, black triangles indicate the case where the thickness is about $0.03\lambda$, and crosses indicate the case where the thickness is about $0.08\lambda$.

As is clear from FIG. 26, the height of the convex portion on the surface of the $SiO_2$ film is preferably no more than half of the thickness of the interdigital electrode and the height should be about $0.04\lambda$ or less. More preferably, the height of the convex portion should be about ⅓ or less of the thickness of the interdigital electrode and the height should be $0.03\lambda$ or less. More preferably, the surface of the $SiO_2$ film is uniform and is not uneven.

In a typical SAW device, an adequate stop band is not generated if the reflection coefficient is low. Therefore, a SAW device having a low reflection coefficient does not operate as a resonator. When a SAW device is used as a SAW resonator, the reflection coefficient of the SAW device must be at least about 0.03. Thus, the thickness of the electrode must be set such that a reflection coefficient of at least about 0.03 is obtained by considering a relationship between the reflection coefficient and the thickness of the electrode. FIGS. 34 to 39 show a relationship between the reflection coefficient in a structure where the surface of the $SiO_2$ film is smoothed and the thickness of respective electrodes made of Au, Ag, Ta, Cu, W, and Al. Herein, a 127.86°-rotated Y-cut X-propagating $LiNbO_3$ substrate is used as a substrate. The Euler angles of this substrate are (0°, 37.86°, 0°).

As shown in FIGS. 34 to 39, even if the thickness of the $SiO_2$ film changes in the range of about $0.2\lambda$ to about $0.5\lambda$, a reflection coefficient of at least about 0.03 is obtained when Au, Ag, Ta, Cu, or W (except Al) is used as a material of the electrode.

Figure 27A:
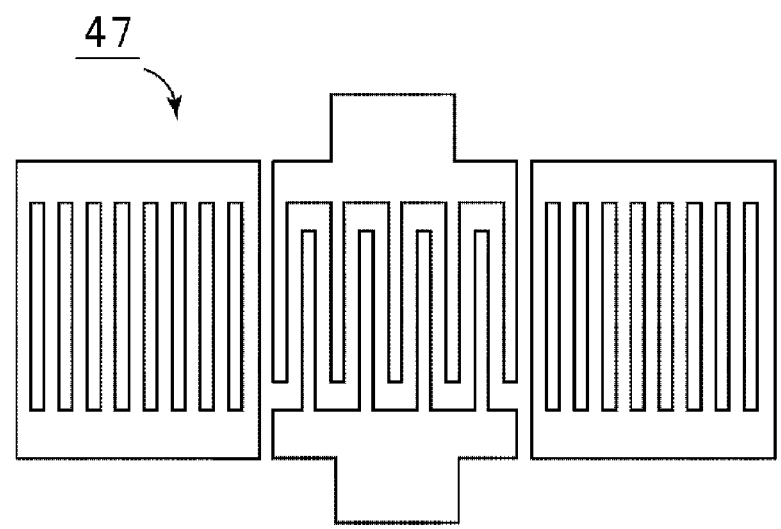
FIGS. 27A and 27B are schematic plan views illustrating a one-port resonator and a two-port resonator as examples of a SAW device to which the present invention is applied.
Figure 27B:
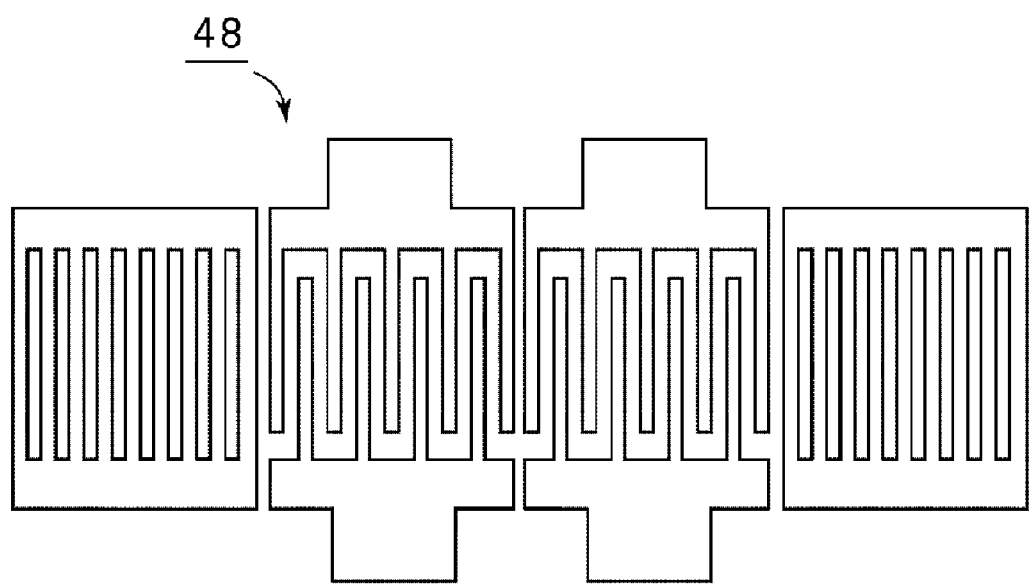
Figure 28:
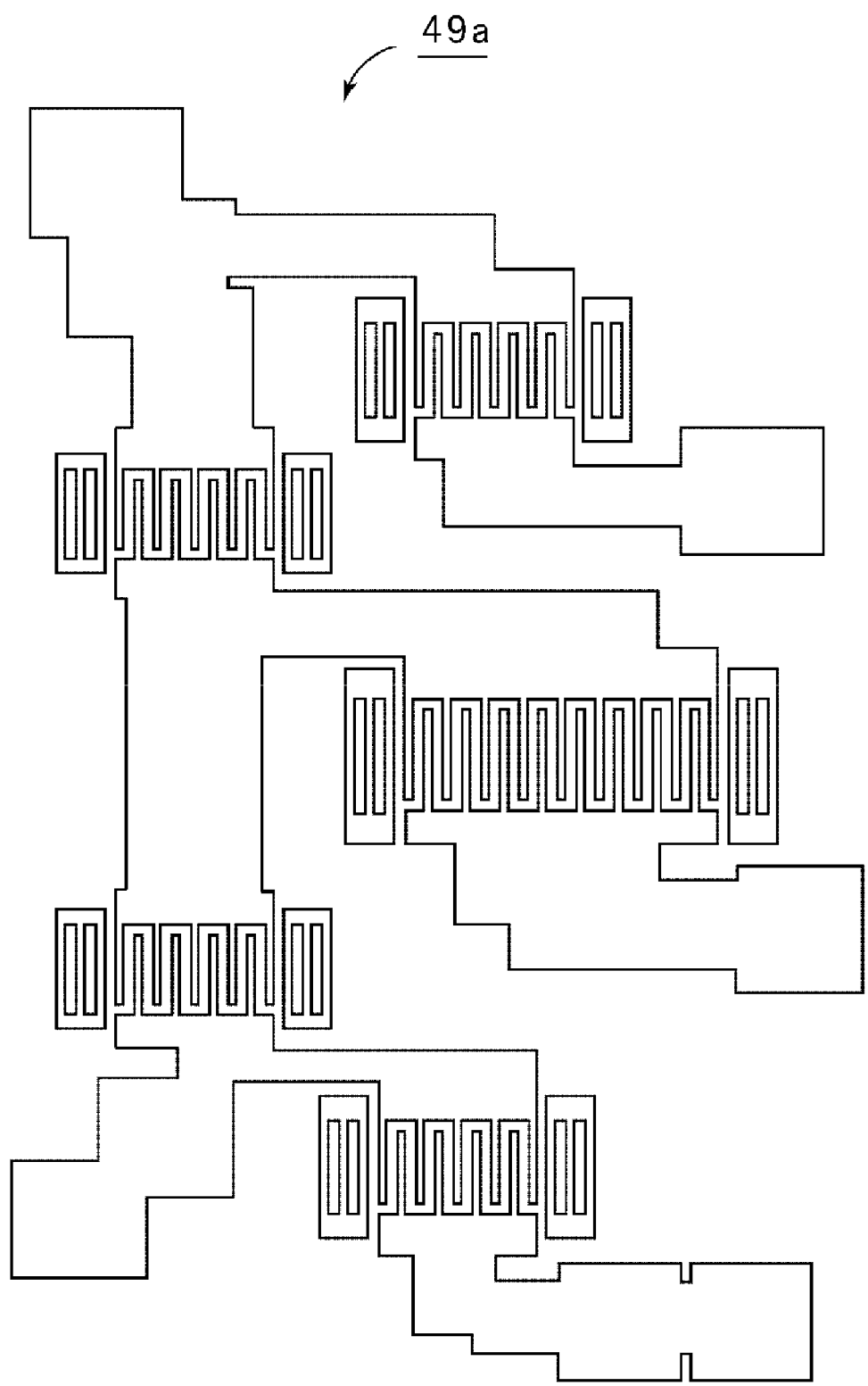
FIG. 28 is a schematic plan view illustrating a ladder filter as a SAW device to which the present invention is applied.
Figure 29:
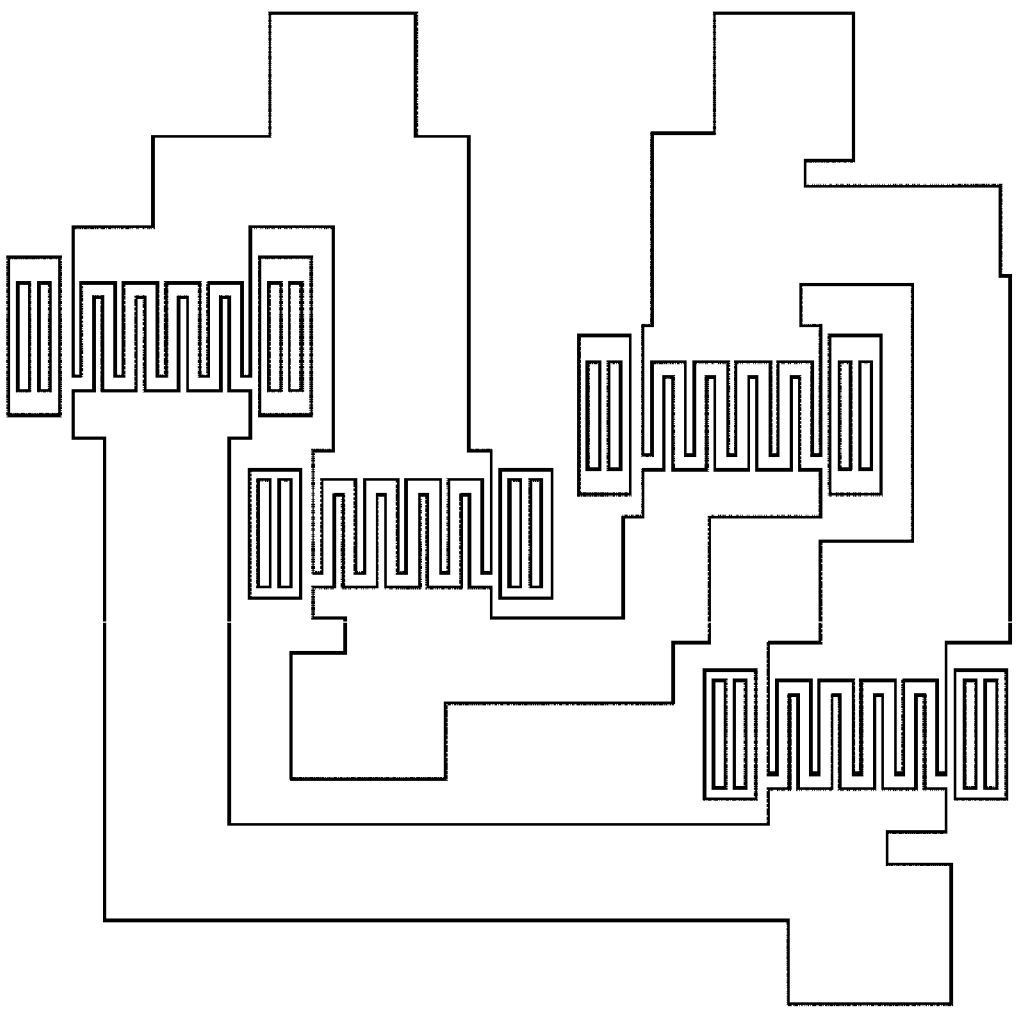
FIG. 29 is a schematic plan view illustrating a lattice filter as a SAW device to which the present invention is applied.
Figure 30A:
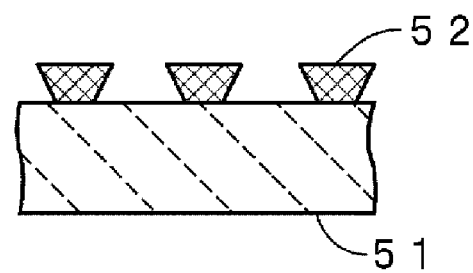
FIGS. 30A to 30D are schematic cross-sectional views showing an example of a method for manufacturing a known SAW device.
Figure 30B:
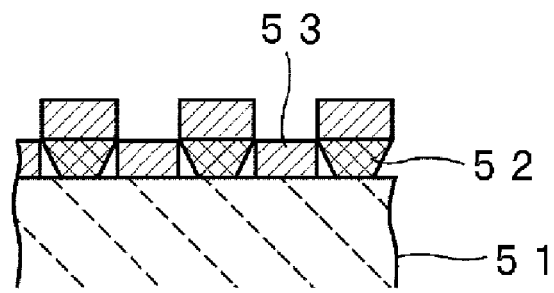
Figure 30C:
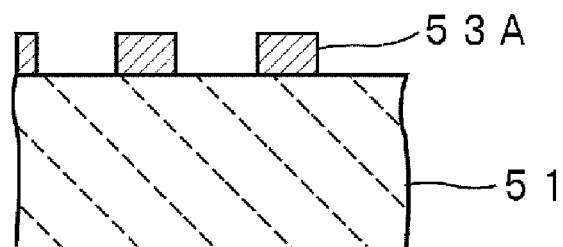
Figure 30D:
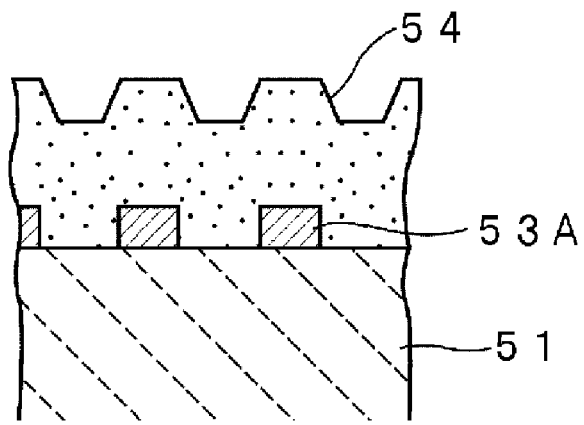
Figure 31:
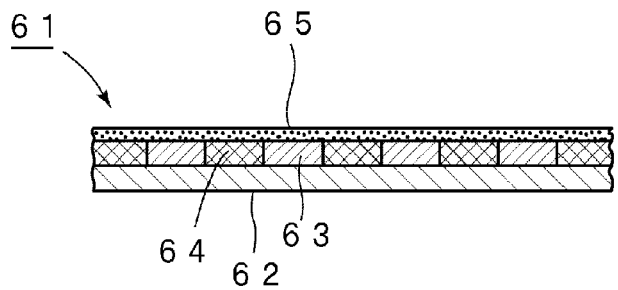
FIG. 31 is a schematic front cross-sectional view illustrating an example of a known SAW device.
Figure 40:
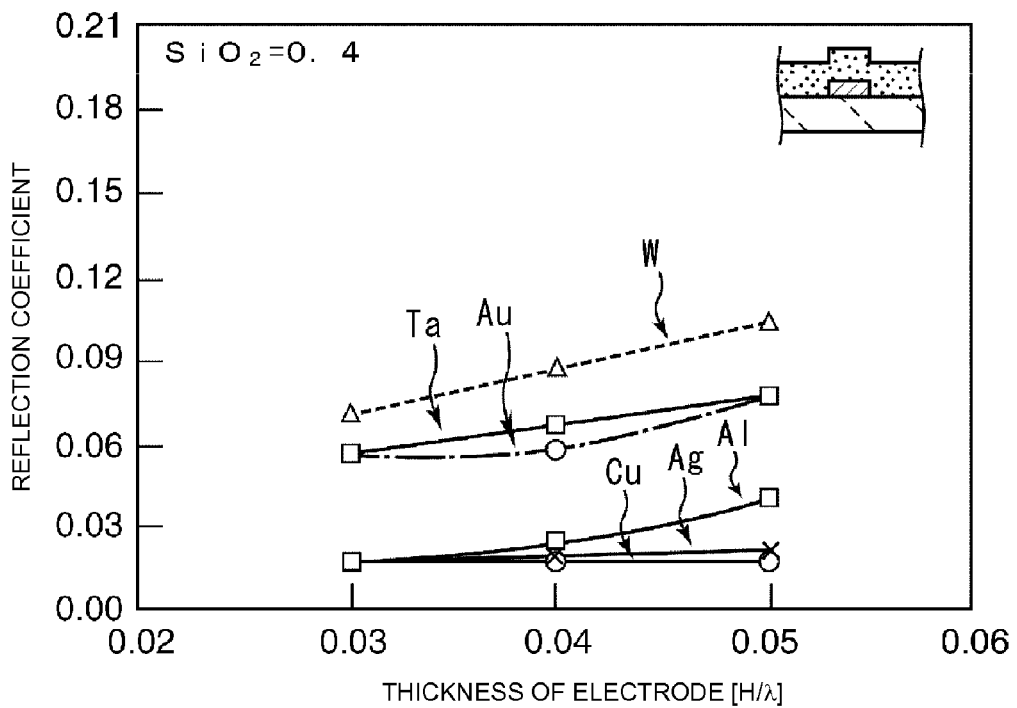
FIG. 40 shows a relationship between the thickness of an electrode and a reflection coefficient in a known SAW device including a SiO$_2$ film covering an IDT electrode and having an uneven surface, in which a LiNbO$_3$ substrate has Euler angles of (0°, 37.86°, 0°) and the thickness and material of the electrode is variously changed.
Figure 41:
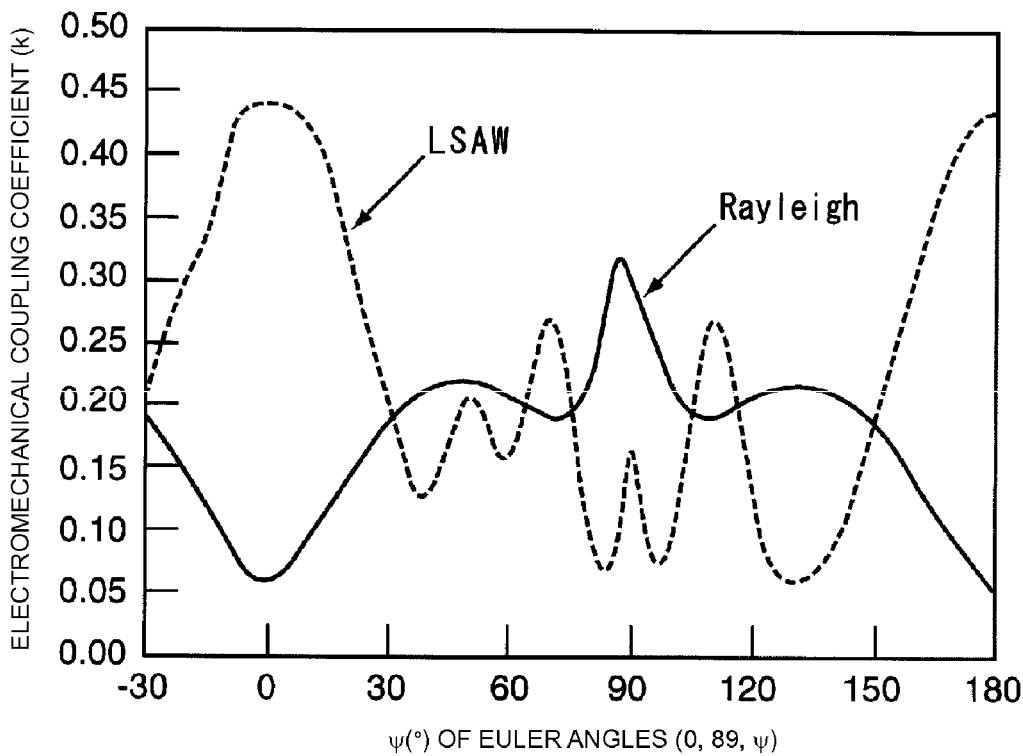
FIG. 41 shows a relationship between ψ in a LiNbO$_3$ substrate having Euler angles of (0°, 89°, ψ) and electromechanical coupling coefficients of a Rayleigh wave and a LSAW.
Figure 42:
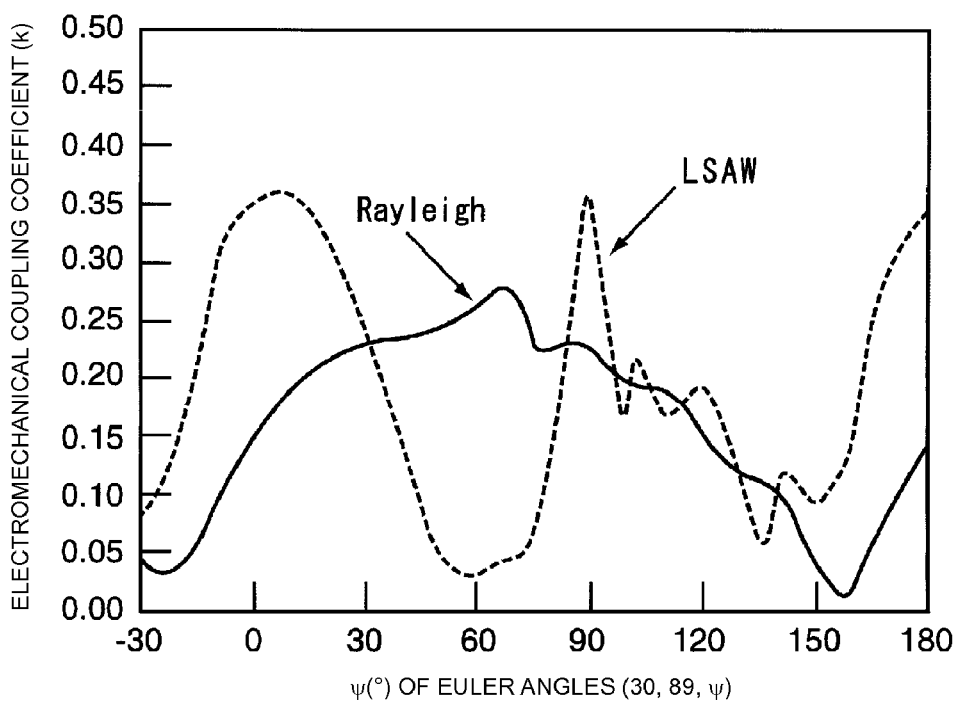
FIG. 42 shows a relationship between ψ in a LiNbO$_3$ substrate having Euler angles of (30°, 89°, ψ) and electromechanical coupling coefficients of a Rayleigh wave and a LSAW.
Figure 43:
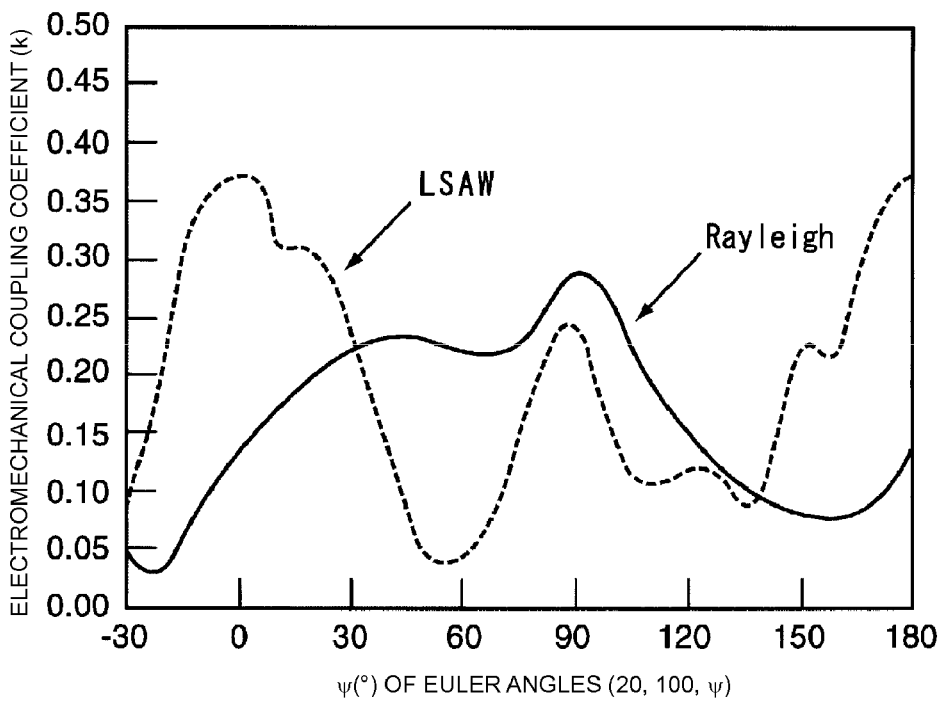
FIG. 43 shows a relationship between ψ in a LiNbO$_3$ substrate having Euler angles of (20°, 100°, ψ) and electromechanical coupling coefficients of a Rayleigh wave and a LSAW.
Figure 44:
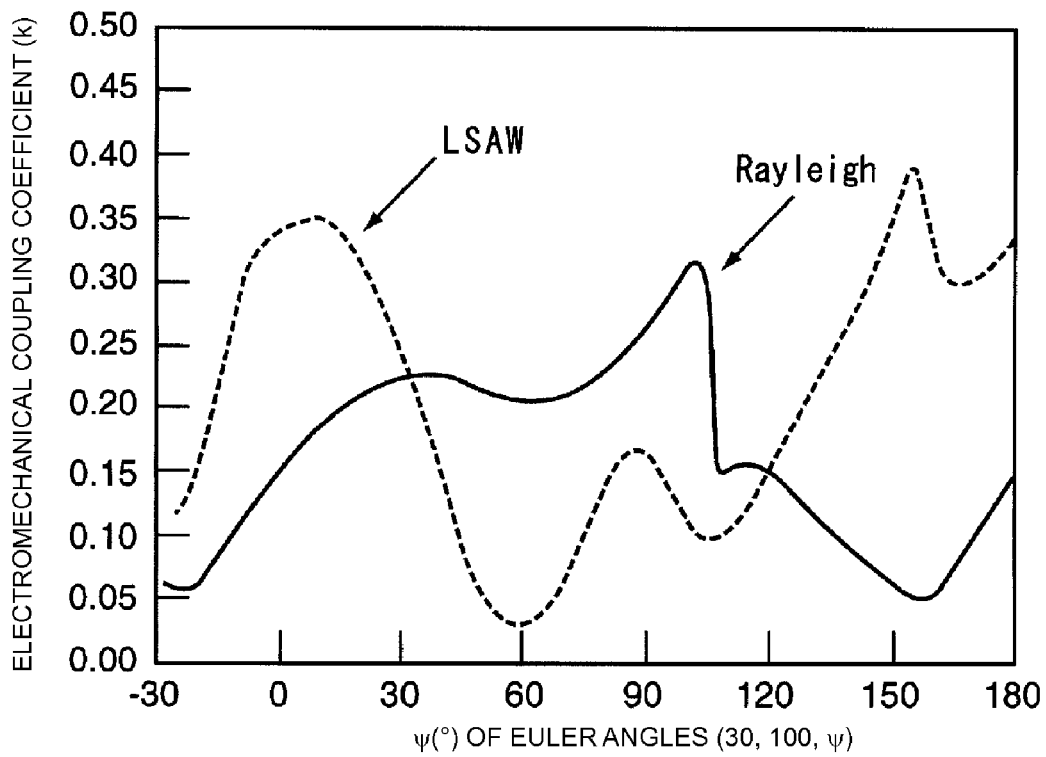
FIG. 44 shows a relationship between ψ in a LiNbO$_3$ substrate having Euler angles of (30°, 100°, ψ) and electromechanical coupling coefficients of a Rayleigh wave and a LSAW.
Figure 45:
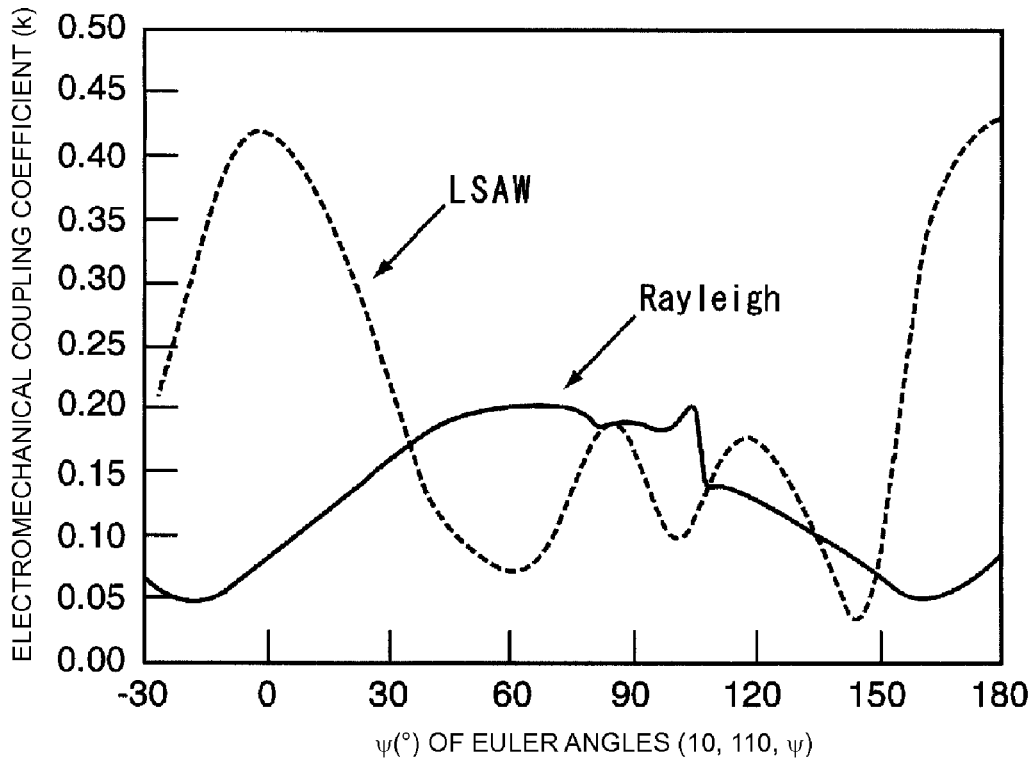
FIG. 45 shows a relationship between ψ in a LiNbO$_3$ substrate having Euler angles of (10°, 110°, ψ) and electromechanical coupling coefficients of a Rayleigh wave and a LSAW.
Figure 46:
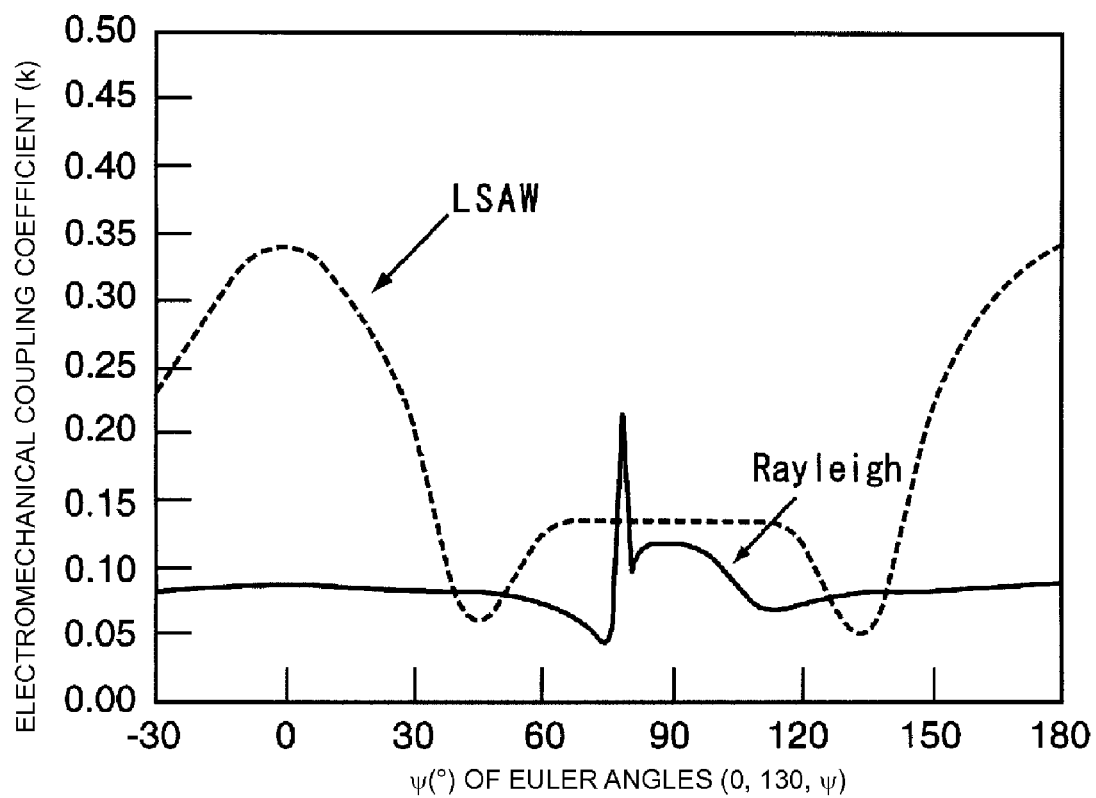
FIG. 46 shows a relationship between ψ in a LiNbO$_3$ substrate having Euler angles of (0°, 130°, ψ) and electromechanical coupling coefficients of a Rayleigh wave and a LSAW.

Incidentally, the range of the vicinity of the above-described Euler angles (0°, 37.86°, 0°) is the range of Euler angles in which the electromechanical coupling coefficient of a Rayleigh wave is high and the electromechanical coupling coefficient of a LSAW is low. In the range of these Euler angles, the reflection coefficient is substantially 0 (zero). For this reason, substrates having those Euler angles have conventionally been used only in transversal filters, in which the reflection coefficient should be low. That is, this type of substrate cannot be used in devices requiring reflection of fingers as shown in FIGS. 27 to 29. Furthermore, in a conventional structure having an uneven surface of a $SiO_2$ film, the reflection coefficient obtained is almost the same as that when Al is used, even if a heavy metal such as Cu or Ag is used for an IDT electrode. FIG. 40 shows a relationship between a reflection coefficient and the thickness of an electrode in a conventional structure with an uneven surface of a $SiO_2$ film.

FIG. 40 shows changes in reflection coefficient according to changes in thickness of an electrode in a conventional structure where an electrode made of different metallic materials is formed on the above-described $LiNbO_3$ substrate having Euler angles of (0°, 37.86°, 0°) and a $SiO_2$ film having a normalized thickness of about $0.4\lambda$ covers the electrode. As shown in FIG. 40, when a $LiNbO_3$ substrate having the above-described Euler angles is used and when the electrode is made of a heavy metal such as Cu, the reflection coefficient obtained is as low as that when Al is used regardless of the thickness of the electrode.

A high electromechanical coupling coefficient of a Rayleigh wave and a low electromechanical coupling coefficient of a LSAW are obtained in a plurality of ranges of Euler angles other than the above-described range. The following Tables 10 and 11 show those ranges of Euler angles. Also, FIGS. 41 to 46 show the ranges of Euler angles.

More specifically, FIGS. 41 to 46 show a relationship between $\psi$ when $LiNbO_3$ substrates having Euler angles of (0°, 89°, $\psi$), (30°, 89°, $\psi$), (20°, 100°, $\psi$), (30°, 100°, $\psi$), (10°, 110°, $\psi$), and (0°, 130°, $\psi$), respectively, are used, and electromechanical coupling coefficients of a Rayleigh wave and a LSAW. As is clear from FIGS. 41 to 46, when $LiNbO_3$ substrates of various Euler angles are used, the electromechanical coupling coefficient of a Rayleigh wave is high and the electromechanical coupling coefficient of a LSAW is low in a plurality of ranges of Euler angles.

Table 10 shows a plurality of ranges of Euler angles ($\phi$, $\theta$, $\psi$) of a $LiNbO_3$ substrate which satisfy $K_{RAY}^2 \geq 0.05$ and $K_{LSAW}^2 \geq 0.02$. Table 11 shows a plurality of ranges of Euler angles ($\phi$, $\theta$, $\psi$) of a $LiNbO_3$ substrate which satisfy $K_{RAY}^2 \geq 0.05$ and $K_{LSAW}^2 \geq 0.01$.

The same characteristics as those shown in FIGS. 34 to 39 can be obtained in the ranges of Euler angles shown in Tables 10 and 11. In the ranges of Euler angles shown in Tables of this description, ±5 or ±10 is the tolerance of an angle calculated by considering a processing accuracy of Euler angles when the devices are mass-produced and a difference in specific gravity of a material of an electrode having a small specific gravity, such as Cu, and a material of an electrode having a very great specific gravity, such as Au.

TABLE 10

| φ | θ | ψ | k RAY | k LSAW | k² RAY | k² LSAW |
|---|---|---|---|---|---|---|
| 0 ± 5 | 38 ± 10 | 0 | 0.29 | 0.10 | 0.0841 | 0.009 |
| 0 ± 5 | 89 ± 10 | 77~102 ± 5 | 0.22~0.31 | 0.06~0.14 | 0.050~0.096 | 0.004~0.020 |
| 0 ± 5 | 130 ± 10 | 79 ± 5 | 0.27 | 0.13 | 0.073 | 0.017 |
| 10 ± 5 | 110 ± 10 | 50~80 ± 5 | 0.22~0.23 | 0.06~0.08 | 0.050~0.053 | 0.004~0.006 |
| 10 ± 5 | 110 ± 10 | 106 ± 5 | 0.22 | 0.11 | 0.048 | 0.012 |
| 20 ± 5 | 100 ± 10 | 35~72 ± 5 | 0.22~0.24 | 0.04~0.14 | 0.050~0.058 | 0.002~0.020 |
| 20 ± 5 | 100 ± 10 | 100~110 ± 5 | 0.22~0.26 | 0.11~0.14 | 0.050~0.068 | 0.012~0.020 |
| 30 ± 5 | 89 ± 10 | 40~80 ± 5 | 0.24~0.28 | 0.04~0.14 | 0.058~0.078 | 0.002~0.020 |
| 30 ± 5 | 100 ± 10 | 40~117 ± 5 | 0.22~0.32 | 0.04~0.14 | 0.050~0.102 | 0.002~0.020 |

TABLE 11

| φ | θ | ψ | k RAY | k LSAW | k² RAY | k² LSAW |
|---|---|---|---|---|---|---|
| 0 ± 5 | 38 ± 10 | 0 | 0.29 | 0.10 | 0.084 | 0.009 |
| 0 ± 5 | 89 ± 10 | 80~100 ± 5 | 0.23~0.25 | 0.05~0.10 | 0.053~0.063 | 0.004~0.010 |
| 10 ± 5 | 110 ± 10 | 50~80 ± 5 | 0.22~0.23 | 0.06~0.08 | 0.050~0.053 | 0.004~0.006 |
| 20 ± 5 | 100 ± 10 | 42~70 ± 5 | 0.22~0.23 | 0.04~0.10 | 0.050~0.053 | 0.002~0.010 |
| 30 ± 5 | 89 ± 10 | 42~76 ± 5 | 0.24~0.28 | 0.04~0.10 | 0.058~0.078 | 0.002~0.010 |
| 30 ± 5 | 100 ± 10 | 42~72 ± 5 | 0.22~0.24 | 0.04~0.10 | 0.050~0.058 | 0.002~0.010 |

Figure 32:
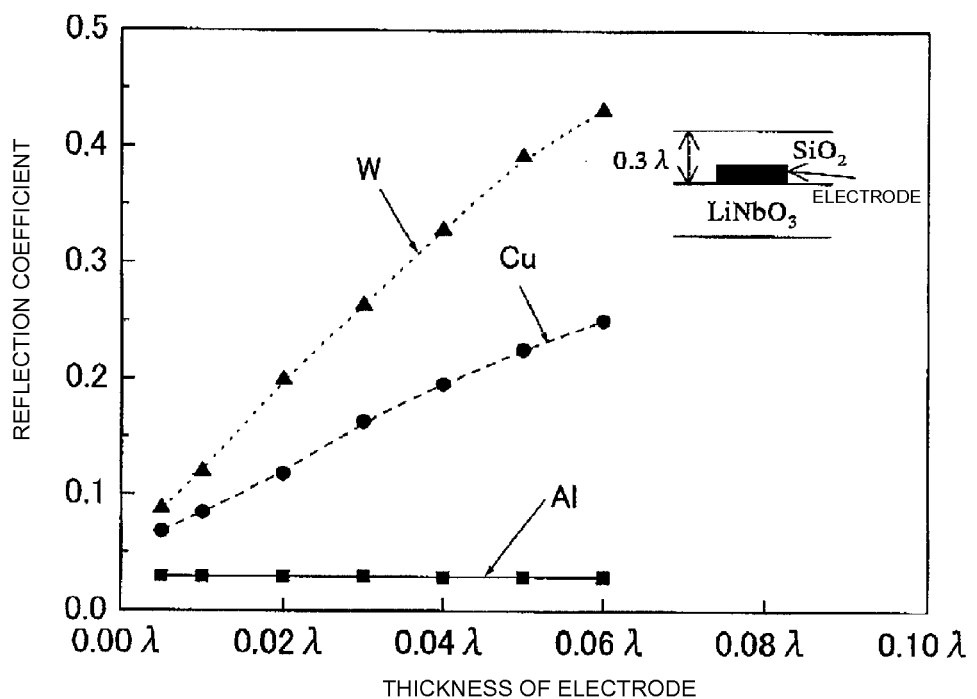
FIG. 32 shows a relationship between the thickness of an electrode and a reflection coefficient when the thickness of a $SiO_2$ film is 0.3λ in a structure including the $SiO_2$ film having a smooth surface, the electrode, and a 13°-rotated Y-cut X-propagating $LiNbO_3$ substrate.

FIG. 32 shows a relationship between a reflection coefficient of each electrode finger of an Al electrode, a W electrode, and a Cu electrode, respectively, and the thickness of the electrode. A SiO₂ film is provided between electrode fingers and on the electrode fingers.

The thickness of the SiO$_2$ film on the substrate is about 0.3λ and the surface of the SiO$_2$ film is even. The substrate is made of 13°-rotated Y-cut X-propagating LiNbO$_3$. As is clear from FIG. 32, Al electrode fingers have a low reflection coefficient, and the reflection coefficient does not increase, even if the film thickness increases. In contrast, electrode fingers made of heavy W or Cu have a higher reflection coefficient than that of Al. Further, the reflection coefficient becomes higher as the film thickness is larger. As described above, an IDT including electrode fingers having a density greater than that of Al has a high reflection coefficient, and thus is suitable for a resonator, a resonator filter, and a ladder filter.

The present invention can be applied to various SAW devices. Examples of those SAW devices are shown in FIGS. 27 to 29. FIGS. 27A and 27B are schematic plan views showing electrode structures of a one-port SAW resonator 47 and a two-port SAW resonator 48, respectively. A two-port SAW resonator filter may be configured by using the same electrode structure as that of the two-port SAW resonator 48 shown in FIG. 27B.

FIGS. 28 and 29 are schematic plan views showing electrode structures of a ladder filter and a lattice filter, respectively. By forming the electrode structure of the ladder filter 49*a* shown in FIG. 28 or the lattice filter 49*b* shown in FIG. 29 on a piezoelectric substrate, a ladder filter or a lattice filter can be configured according to preferred embodiments of the present invention.

The present invention can be applied to various SAW devices, in addition to the SAW devices having the electrode structures shown in FIGS. 27 to 29.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A surface acoustic wave device comprising:
   a piezoelectric substrate made of LiNbO$_3$ having an electromechanical coupling coefficient whose square (k²) is at least about 0.025;
   at least one electrode made of one of a metal whose density is greater than that of Al, an alloy primarily including the metal or that is composed of laminated films made of a metal whose density is greater than that of Al or an alloy primarily including the metal and another metal, the at least one electrode being disposed on the piezoelectric substrate;
   a first insulating layer disposed in a region other than a region where said at least one electrode is disposed, a thickness of the first insulating layer being substantially equal to that of the at least one electrode; and
   a second insulating layer covering the at least one electrode and the first insulating layer; wherein
   a density of the at least one electrode is at least about 1.5 times greater than that of the first insulating layer.

2. The surface acoustic wave device according to claim 1, wherein the first and second insulating layers are made of SiO$_2$.

3. The surface acoustic wave device according to claim 1, wherein reflection of surface acoustic waves is used in the surface acoustic wave device.

4. The surface acoustic wave device according to claim 1, wherein a height of a convex portion on a surface of the second insulating layer is about 0.03λ or less when the wavelength of a surface acoustic wave is λ.

5. The surface acoustic wave device according to claim 1, wherein a height of a convex portion on the second insulating layer is about ½ or less of the thickness of the electrode.

6. The surface acoustic wave device according to claim 5, wherein the height of the convex portion on the second insulating layer is about ⅓ or less of the thickness of the electrode.

7. The surface acoustic wave device according to claim 1, wherein the electrode primarily includes a metal heavier than Al.

8. The surface acoustic wave device according to claim 7, wherein the electrode primarily includes a metal selected from a group consisting of Au, Pt, Cu, Ta, W, Ag, Ni, Mo, NiCr, Cr, and Ti.

9. The surface acoustic wave device according to claim 8, wherein the electrode is made of one of Au and Pt and a thickness thereof is in the range of about 0.0017λ to about 0.06λ when the wavelength of a surface acoustic wave is λ.

10. The surface acoustic wave device according to claim 8, wherein the electrode primarily includes a metal selected from a group consisting of Au, Ag, Ni, Mo, Zn, Cu, Pt, Ta, W, Cr, and Ti, and the thickness of the electrode is in the range shown in the following Table 1 when the wavelength of a surface acoustic wave is λ:

TABLE 1

| | |
|---|---|
| Au | 0.0017 λ~0.06 λ |
| Pt | 0.0017 λ~0.06 λ |
| Ag | 0.0035 λ~0.10 λ |
| Ta | 0.0025 λ~0.064 λ |
| W | 0.0035 λ~0.06 λ |
| Cu | 0.0058 λ~0.11 λ |
| Ni | 0.012 λ~0.12 λ |
| Cr | 0.012 λ~0.12 λ |
| Ti | 0.012 λ~0.12 λ |
| Mo | 0.012 λ~0.12 λ |
| Zn | 0.012 λ~0.12 λ. |

11. The surface acoustic wave device according to claim 1, wherein a thickness of the second insulating layer is in the range of about 0.15λ to about 0.4λ when the wavelength of a surface acoustic wave is λ.

12. The surface acoustic wave device according to claim 11, wherein the thickness of the second insulating layer is in the range of about 0.2λ to about 0.3λ.

13. The surface acoustic wave device according to claim 1, wherein Euler angles of the piezoelectric substrate made of LiNbO₃ are in any of the ranges shown in the following Table 2:

TABLE 2

| Euler angles |
|---|
| (0 ± 5, 62~167, 0 ± 10) |
| (0 ± 5, 87~158, 20 ± 10) |
| (0 ± 5, 112~165, 80 ± 10) |
| (0 ± 5, 107~167, 100 ± 10) |
| (10 ± 5, 110~162, 80 ± 10) |
| (10 ± 5, 69~108, 100 ± 10) |
| (10 ± 5, 72~140, 160 ± 10) |
| (20 ± 5, 99~121, 160 ± 10) |
| (30 ± 5, 67~113, 0 ± 10) |
| (30 ± 5, 27~125, 140 ± 10) |
| (30 ± 5, 67~103, 160 ± 10). |

14. The surface acoustic wave device according to claim 13, wherein Euler angles of the piezoelectric substrate made of LiNbO₃ are in any of the ranges shown in the following Table 3:

TABLE 3

| $k_R^2 \leq 0.01$ |
|---|
| (0 ± 5, 80~160, 0 ± 10) |
| (0 ± 5, 100~142, 0 ± 10) |
| (0 ± 5, 112~165, 80 ± 10) |
| (0 ± 5, 107~167, 100 ± 10) |
| (10 ± 5, 123~158, 80 ± 10) |
| (10 ± 5, 74~90, 100 ± 10) |
| (10 ± 5, 87~128, 160 ± 10) |
| (20 ± 5, 99~119, 160 ± 10) |
| (30 ± 5, 82~98, 0 ± 10) |
| (30 ± 5, 28~53, 140 ± 10) |
| (30 ± 5, 70~103, 160 ± 10). |

15. The surface acoustic wave device according to claim 14, wherein Euler angles of the piezoelectric substrate made of LiNbO₃ are in any of the ranges shown in the following Table 4:

TABLE 4

| $k_R^2 \leq 0.049$ |
|---|
| (0 ± 5, 88~117, 0 ± 10) |
| (0 ± 5, 115~124, 0 ± 10) |
| (0 ± 5, 115~135, 80 ± 10) |
| (0 ± 5, 109~157, 100 ± 10) |
| (10 ± 5, 130~146, 80 ± 10) |
| (10 ± 5, 80~87, 100 ± 10) |
| (10 ± 5, 98~118, 160 ± 10) |
| (20 ± 5, 110~118, 160 ± 10) |
| (30 ± 5, 86~94, 0 ± 10) |
| (30 ± 5, 33~47, 140 ± 10) |
| (30 ± 5, 77~103, 160 ± 10). |

16. The surface acoustic wave device according to claim 1, wherein Euler angles of the piezoelectric substrate made of LiNbO₃ are in any of the ranges shown in the following Table 5:

TABLE 5

| Euler angles |
|---|
| (0 ± 5, 38 ± 10, 0) |
| (0 ± 5, 89 ± 10, 77~102 ± 5) |
| (0 ± 5, 130 ± 10, 79 ± 5) |
| (10 ± 5, 110 ± 10, 50~80 ± 5) |
| (10 ± 5, 110 ± 10, 106 ± 5) |
| (20 ± 5, 100 ± 10, 35~72 ± 5) |
| (20 ± 5, 100 ± 10, 100~110 ± 5) |
| (30 ± 5, 89 ± 10, 40~80 ± 5) |
| (30 ± 5, 100 ± 10, 40~117 ± 5). |

17. The surface acoustic wave device according to claim 16, wherein Euler angles of the piezoelectric substrate made of LiNbO₃ are in any of the ranges shown in the following Table 6:

TABLE 6

| Euler angles |
|---|
| (0 ± 5, 38 ± 10, 0) |
| (0 ± 5, 89 ± 10, 80~100 ± 5) |
| (10 ± 5, 110 ± 10, 50~80 ± 5) |
| (20 ± 5, 100 ± 10, 42~70 ± 5) |

TABLE 6-continued

| Euler angles |
| --- |
| (30 ± 5, 89 ± 10, 42~76 ± 5) |
| (30 ± 5, 100 ± 10, 42~72 ± 5). |

18. A surface acoustic wave device comprising:
a piezoelectric substrate made of LiNbO$_3$;
at least one electrode disposed on the piezoelectric substrate;
a protective metal film made of a metal or alloy that is more corrosion-resistant than a metal or alloy included in the electrode, the protective metal film being disposed on the electrode;
a first insulating layer disposed in a region other than a region where said at least one electrode is disposed, a thickness of the first insulating layer being substantially equal to a total thickness of the at least one electrode and the protective metal film; and
a second insulating layer covering the protective metal film and the first insulating layer.

19. The surface acoustic wave device according to claim 18, wherein an average density of an entire laminated structure including the at least one electrode and the protective metal film is at least about 1.5 times greater than the density of the first insulating layer.

20. The surface acoustic wave device according to claim 18, wherein the first and second insulating layers are made of SiO$_2$.

21. The surface acoustic wave device according to claim 18, wherein reflection of surface acoustic waves is used in the surface acoustic wave device.

22. The surface acoustic wave device according to claim 18, wherein a height of a convex portion on a surface of the second insulating layer is about 0.03λ or less when the wavelength of a surface acoustic wave is λ.

23. The surface acoustic wave device according to claim 18, wherein a height of a convex portion on the second insulating layer is about ½ or less of the thickness of the electrode.

24. The surface acoustic wave device according to claim 23, wherein the height of the convex portion on the second insulating layer is about ⅓ or less of the thickness of the electrode.

25. The surface acoustic wave device according to claim 18, wherein the electrode primarily includes a metal heavier than Al.

26. The surface acoustic wave device according to claim 25, wherein the electrode primarily includes a metal selected from a group consisting of Au, Pt, Cu, Ta, W, Ag, Ni, Mo, NiCr, Cr, and Ti.

27. The surface acoustic wave device according to claim 26, wherein the electrode is made of one of Au and Pt and a thickness thereof is in the range of about 0.0017λ to about 0.06λ when the wavelength of a surface acoustic wave is λ.

28. The surface acoustic wave device according to claim 26, wherein the electrode primarily includes a metal selected from a group consisting of Au, Ag, Ni, Mo, Zn, Cu, Pt, Ta, W, Cr, and Ti, and the thickness of the electrode is in the range shown in the following Table 1 when the wavelength of a surface acoustic wave is λ:

TABLE 1

| | |
| --- | --- |
| Au | 0.0017 λ~0.06 λ |
| Pt | 0.0017 λ~0.06 λ |
| Ag | 0.0035 λ~0.10 λ |
| Ta | 0.0025 λ~0064 λ |
| W | 0.0035 λ~0.06 λ |
| Cu | 0.0058 λ~0.11 λ |
| Ni | 0.012 λ~0.12 λ |
| Cr | 0.012 λ~0.12 λ |
| Ti | 0.012 λ~0.12 λ |
| Mo | 0.012 λ~0.12 λ |
| Zn | 0.012 λ~0.12 λ. |

29. The surface acoustic wave device according to claim 18, wherein a thickness of the second insulating layer is in the range of about b 0.15λ to about 0.4λ when the wavelength of a surface acoustic wave is λ.

30. The surface acoustic wave device according to claim 29, wherein the thickness of the second insulating layer is in the range of about 2λ to about 0.3λ.

31. The surface acoustic wave device according to claim 18, wherein Euler angles of the piezoelectric substrate made of LiNbO$_3$ are in any of the ranges shown in the following Table 2:

TABLE 2

| Euler angles |
| --- |
| (0 ± 5, 62~167, 0 ± 10) |
| (0 ± 5, 87~158, 20 ± 10) |
| (0 ± 5, 112~165, 80 ± 10) |
| (0 ± 5, 107~167, 100 ± 10) |
| (10 ± 5, 110~162, 80 ± 10) |
| (10 ± 5, 69~108, 100 ± 10) |
| (10 ± 5, 72~140, 160 ± 10) |
| (20 ± 5, 99~121, 160 ± 10) |
| (30 ± 5, 67~113, 0 ± 10) |
| (30 ± 5, 27~125, 140 ± 10) |
| (30 ± 5, 67~103, 160 ± 10). |

32. The surface acoustic wave device according to claim 31, wherein Euler angles of the piezoelectric substrate made of LiNbO$_3$ are in any of the ranges shown in the following Table 3:

TABLE 3

| k$_R$$^2$ ≦ 0.01 |
| --- |
| (0 ± 5, 80~160, 0 ± 10) |
| (0 ± 5, 100~142, 0 ± 10) |
| (0 ± 5, 112~165, 80 ± 10) |
| (0 ± 5, 107~167, 100 ± 10) |
| (10 ± 5, 123~158, 80 ± 10) |
| (10 ± 5, 74~90, 100 ± 10) |
| (10 ± 5, 87~128, 160 ± 10) |
| (20 ± 5, 99~119, 160 ± 10) |
| (30 ± 5, 82~98, 0 ± 10) |
| (30 ± 5, 28~53, 140 ± 10) |
| (30 ± 5, 70~103, 160 ± 10). |

33. The surface acoustic wave device according to claim 32, wherein Euler angles of the piezoelectric substrate made of LiNbO$_3$ are in any of the ranges shown in the following Table 4:

TABLE 4

| $k_R^2 \leq 0.049$ |
| --- |
| (0 ± 5, 88~117, 0 ± 10) |
| (0 ± 5, 115~124, 0 ± 10) |
| (0 ± 5, 115~135, 80 ± 10) |
| (0 ± 5, 109~157, 100 ± 10) |
| (10 ± 5, 130~146, 80 ± 10) |
| (10 ± 5, 80~87, 100 ± 10) |
| (10 ± 5, 98~118, 160 ± 10) |
| (20 ± 5, 110~118, 160 ± 10) |
| (30 ± 5, 86~94, 0 ± 10) |
| (30 ± 5, 33~47, 140 ± 10) |
| (30 ± 5, 77~103, 160 ± 10). |

34. The surface acoustic wave device according to claim 18, wherein Euler angles of the piezoelectric substrate made of LiNbO$_3$ are in any of the ranges shown in the following Table 5:

TABLE 5

| Euler angles |
| --- |
| (0 ± 5, 38 ± 10, 0) |
| (0 ± 5, 89 ± 10, 77~102 ± 5) |
| (0 ± 5, 130 ± 10, 79 ± 5) |
| (10 ± 5, 110 ± 10, 50~80 ± 5) |

TABLE 5-continued

| Euler angles |
| --- |
| (10 ± 5, 110 ± 10, 106 ± 5) |
| (20 ± 5, 100 ± 10, 35~72 ± 5) |
| (20 ± 5, 100 ± 10, 100~110 ± 5) |
| (30 ± 5, 89 ± 10, 40~80 ± 5) |
| (30 ± 5, 100 ± 10, 40~117 ± 5). |

35. The surface acoustic wave device according to claim 34, wherein Euler angles of the piezoelectric substrate made of LiNbO$_3$ are in any of the ranges shown in the following Table 6:

TABLE 6

| Euler angles |
| --- |
| (0 ± 5, 38 ± 10, 0) |
| (0 ± 5, 89 ± 10, 80~100 ± 5) |
| (10 ± 5, 110 ± 10, 50~80 ± 5) |
| (20 ± 5, 100 ± 10, 42~70 ± 5) |
| (30 ± 5, 89 ± 10, 42~76 ± 5) |
| (30 ± 5, 100 ± 10, 42~72 ± 5). |

* * * * *